United States Patent
Kanamori et al.

(10) Patent No.: US 7,233,172 B2
(45) Date of Patent: Jun. 19, 2007

(54) DIFFERENTIAL AMPLIFIER CIRCUIT CAPABLE OF ACCURATELY AMPLIFYING EVEN HIGH-SPEEDED SIGNAL OF SMALL AMPLITUDE

(75) Inventors: Yoshie Kanamori, Kawasaki (JP); Hideki Takauchi, Kawasaki (JP); Hideki Ishida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/072,872

(22) Filed: Feb. 12, 2002

(65) Prior Publication Data

US 2002/0171453 A1   Nov. 21, 2002

(30) Foreign Application Priority Data

May 15, 2001   (JP)   ............... 2001-145298

(51) Int. Cl.
   *G01R 19/00*   (2006.01)
(52) U.S. Cl. ................................. 327/55; 327/57
(58) Field of Classification Search ............ 327/50–52, 327/54, 55, 57, 379, 215, 217–219, 389, 327/391, 108; 365/205, 207; 326/86, 82, 326/83; 330/304; 375/229, 230, 263, 232, 375/346, 348, 350

See application file for complete search history.

(56) References Cited

U.S. PATENT DOCUMENTS

| | | | | |
|---|---|---|---|---|
| 5,508,644 | A | * | 4/1996 | Branson et al. ............... 327/57 |
| 5,903,513 | A | * | 5/1999 | Itou ......................... 365/207 |
| 6,107,853 | A | * | 8/2000 | Nikolic et al. .............. 327/217 |
| 6,232,810 | B1 | * | 5/2001 | Oklobdzija et al. ......... 327/217 |

FOREIGN PATENT DOCUMENTS

| | | |
|---|---|---|
| JP | 57-164618 | 10/1982 |
| JP | 6-84357 | 3/1994 |
| JP | 8-83488 | 3/1996 |
| JP | 9-294068 | 11/1997 |

* cited by examiner

*Primary Examiner*—Long Nguyen
(74) *Attorney, Agent, or Firm*—Arent Fox LLP

(57) ABSTRACT

A differential amplifier circuit has a latch unit and a differential input portion. A minute current is kept to flow through the differential input portion. Therefore, the differential amplifier circuit can accurately amplify even a signal high in speed and small in amplitude.

33 Claims, 32 Drawing Sheets

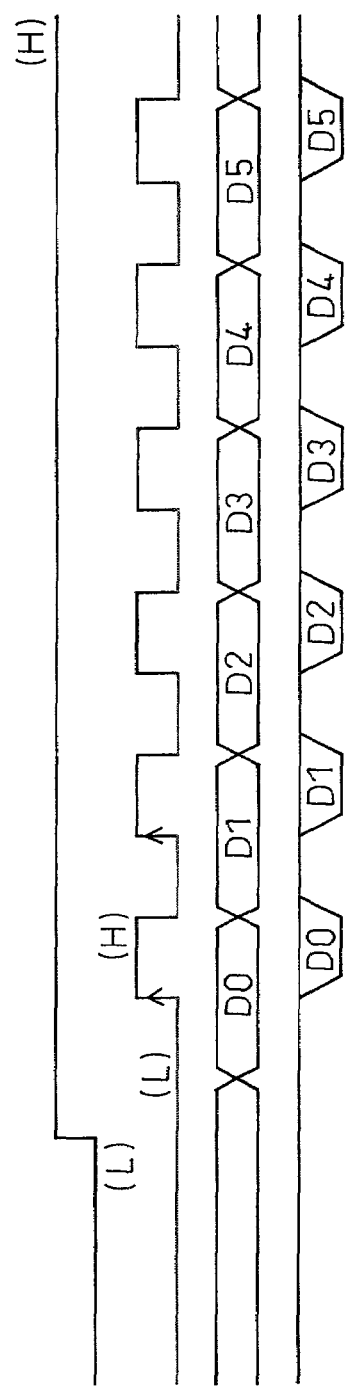

3221

510

521

DIFFERENTIAL AMPLIFIER CIRCUIT CAPABLE OF ACCURATELY AMPLIFYING EVEN HIGH-SPEEDED SIGNAL OF SMALL AMPLITUDE

BACKGROUND OF THE INVENTION

1. Field of the Invention

The present invention relates to a differential amplifier circuit and a semiconductor integrated circuit device, and more particular, to a differential amplifier circuit mounted on a receiving circuit of a signal transmission system.

2. Description of the Related Art

Recently, the performance of components used in computers and other information processing apparatuses has been greatly improved. In particular, dramatic improvements have been made, for example, in the performance of processors and semiconductor memory devices such as SRAMs (Static Random Access Memories) and DRAMs (Dynamic Random Access Memories). The improvements in the performance of semiconductor memory devices, processors, and the like have come to the point where system performance cannot be improved further unless the speed of signal transmission between components or elements is increased.

Specifically, the speed of signal transmission between a main memory device such as a DRAM and a processor (i.e., between LSIs), for example, is becoming a bottleneck impeding performance improvement for a computer as a whole. Furthermore, the need for the improvement of signal transmission speed is increasing not only for signal transmission between cabinets or boards (printed wiring boards), such as between a server and a main memory device or between servers connected via a network, but also for signal transmission between chips or between devices or circuit blocks within a chip because of increasing integration and increasing size of semiconductor chips, decreasing supply voltage levels (low-voltage-swing signals), etc.

The signal is transmitted at high speed often with a small amplitude to prevent the loss of the high frequency component or the signal reflection. For this reason, the receiving circuit is required to include a signal amplifier circuit capable of amplifying the signal of small amplitude accurately, and a signal amplifier circuit (differential amplifier circuit) meeting this requirement has been in demand.

The prior art and the problems associated with the prior art will be described in detail later with reference to accompanying drawings.

SUMMARY OF THE INVENTION

An object of the present invention is to provide a differential amplifier circuit and a semiconductor integrated circuit device having the differential amplifier circuit capable of accurately amplifying even a high-speed signal of small amplitude.

According to the present invention, there is provided a differential amplifier circuit comprising a latch unit and a differential input portion, wherein a minute current is kept to flow through the differential input portion.

The differential input portion may comprise a first transistor and a second transistor each having a first electrode, a second electrode and a control electrode; the control electrodes of the first and second transistors may be supplied with a differential input signal; and a third transistor for keeping a minute current to flow through the first and second transistors may be inserted between a first power line and a common node to which the first electrodes of the first and second transistors are connected. The third transistor may turn off the minute current flowing through the first and second transistors upon deactivation of the differential amplifier circuit.

A fourth transistor for supplying a drive current at the time of signal determination in the differential amplifier circuit may be inserted between the first power line and the common node to which the first electrodes of the first and second transistors are connected; and the third transistor may be connected in parallel to the fourth transistor. The control electrode of the third transistor may be supplied with a first control signal for constantly supplying a minute current during the operation of the differential amplifier. A gate width of the third transistor may be smaller than a gate width of the fourth transistor. The third transistor may double as a transistor for supplying a drive current at the time of signal determination by the differential amplifier circuit. The first control signal supplied to the control electrode of the third transistor may be set to a level for supplying a predetermined drive current at the time of signal determination in the differential amplifier circuit, while causing a minute current to flow through the first and second transistors at other than the time of signal determination during the operation of the differential amplifier.

The latch unit may comprise a first inverter inserted between the second electrode of the first transistor and a second power line; and a second inverter inserted between the second electrode of the second transistor and the second power line, the first and second inverters being cross-coupled to each other. The differential amplifier circuit may be configured of MOS transistors; transistors of the first and second inverters which are connected to the second power line may be each connected in parallel to an additional transistor, respectively; and the second electrode of each of the first and second transistors may be held at a predetermined level at other than the time of signal determination during the operation of the differential amplifier.

The differential amplifier circuit may further comprise a fifth transistor connected to the second electrode of the first transistor and the second electrode of the second electrode for shorting the second electrodes of the first and second transistors in accordance with a second control signal. The differential amplifier circuit may further comprise a sixth transistor connected to the second electrode of the first transistor and the second electrode of the second transistor, the sixth transistor having a control electrode supplied with a predetermined voltage. The differential input signal may be at CML level.

The differential amplifier circuit may further comprise a seventh transistor inserted between two nodes for retrieving a differential output signal, the seventh transistor shorting the two nodes in accordance with a third control signal. The differential amplifier circuit may further comprise an eighth transistor inserted between the second power line and the common node to which the first electrodes of the first and second transistors are connected, the control electrode of the eighth transistor being supplied with a fourth control signal. The differential amplifier circuit may be a differential sense amplifier circuit of strong arm latch type.

Further, according to the present invention, there is also provided a semiconductor integrated circuit device having a differential amplifier circuit receiving a differential signal, a latch circuit latching an output signal of the differential amplifier circuit, and a clock source generating a clock and supplying the generated clock to the differential amplifier circuit, wherein the differential amplifier circuit comprises a latch unit and a differential input portion, wherein a minute current is kept to flow through the differential input portion.

The semiconductor integrated circuit may be a receiving circuit of a signal transmission system, the signal transmission system comprising a transmission circuit outputting the differential signal, a signal transmission path, and the receiving circuit receiving the differential signal through the signal transmission path. The semiconductor integrated circuit device may further comprise an equalizer circuit, receiving the differential signal, removing an Inter-Symbol Interference of the differential signal by a Partial Response Detection, and outputting the Inter-Symbol Interference removed differential signal to the differential amplifier circuit. The semiconductor integrated circuit device may comprise a plurality of receiving units each including the differential amplifier circuit, the latch circuit and the equalizer circuit, the plurality of receiving units carrying out an interleave operation.

BRIEF DESCRIPTION OF THE DRAWINGS

The present invention will be more clearly understood from the description of the preferred embodiments as set forth below with reference to the accompanying drawings, wherein:

FIG. 10 is a timing chart for explaining the operation of the differential amplifier circuits shown in FIGS. 8 and 9;

DESCRIPTION OF THE PREFERRED EMBODIMENTS

Before describing embodiments of the invention in detail, the conventional differential amplifier circuit and the conventional semiconductor integrated circuit devices and the problem points thereof will be explained with reference to the accompanying drawings.

Figure 1:
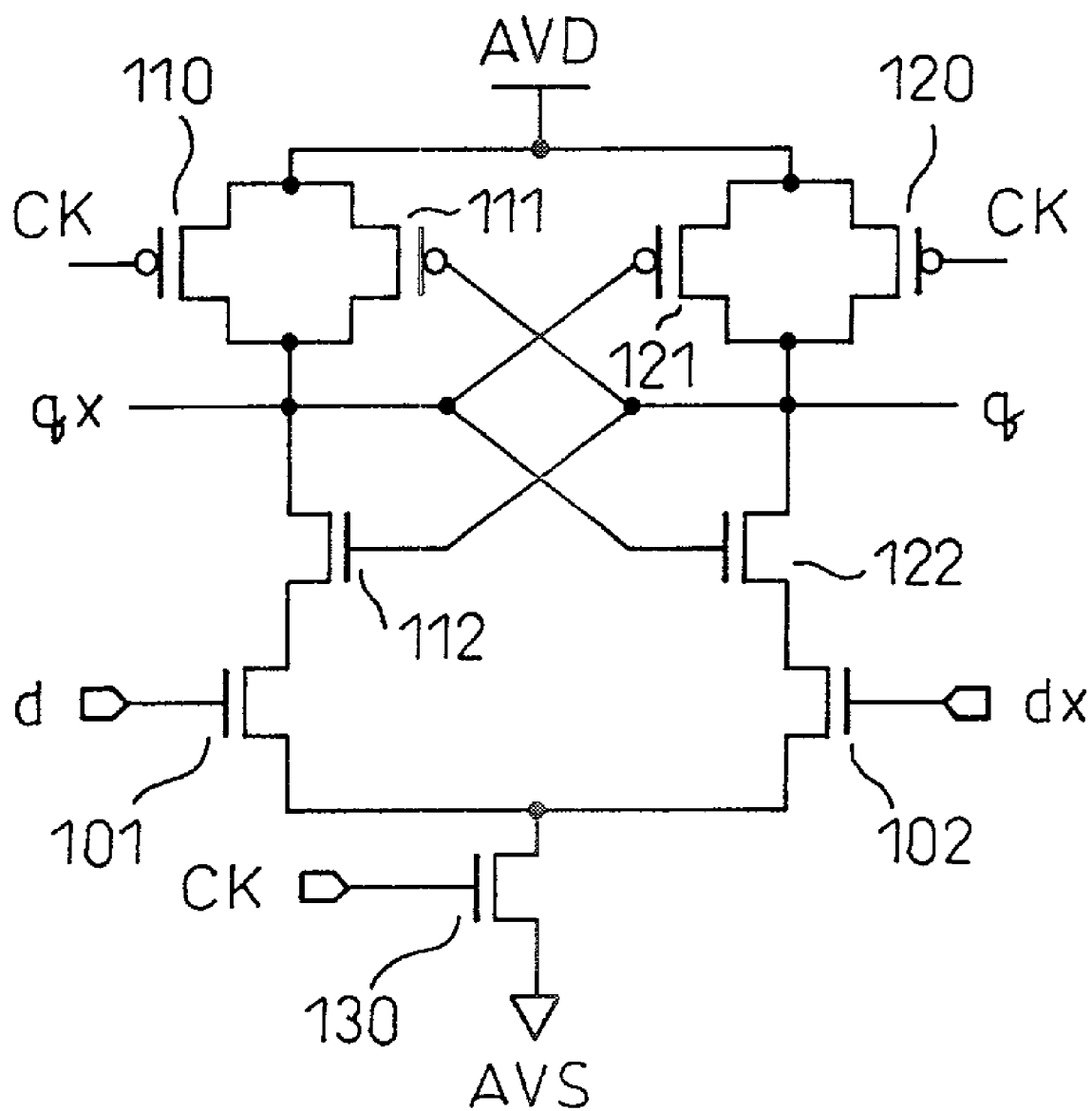
FIG. 1 is a circuit diagram for explaining an example of the conventional differential amplifier circuit.

FIG. 1 is a circuit diagram for explaining an example of a conventional differential amplifier circuit, which is a differential sense amplifier circuit of strong arm latch type comprising CMOS transistors.

In FIG. 1, reference character AVD designates a high potential power line, character AVS a low potential power line, reference numerals 101, 102, 112, 122, 130 designate N-channel MOS transistors (NMOS transistors), and numerals 110, 111, 120, 121 P-channel MOS transistors (PMOS transistors). Reference character CK designates a clock, characters d, dx differential input signals (complementary input signals), and characters q, qx differential outputs (complementary output signals, complementary output nodes). The transistors 111 and 112 make up a first inverter, and the transistors 121 and 122 make up a second inverter. The first and second inverters are cross-coupled to make up a latch unit.

The source of the input transistor 101 of which the gate is supplied with the input signal and the source of the input transistor 102 of which the gate is supplied with the input signal dx are connected to a common terminal on the one hand, and connected to a low potential power line AVS through the transistor 130 of which the gate is supplied with the clock CK. The drain of the input transistor 101 is connected to a high potential power line AVD through the first inverter (transistors 111, 112). Similarly, the drain of the input transistor 102 is connected to the high potential power line AVD through the second inverter (transistors 121, 122). The PMOS transistors 111 and 121 making up an inverter are connected in parallel to the PMOS transistors 110 and 120, respectively, each having the gate thereof supplied with the clock CK.

In the differential sense amplifier circuit of strong arm latch type shown in FIG. 1, assume that the clock CK rises to high level "H". The transistor 130 turns on, and a current path is formed from the high potential power line AVD to the low potential power line AVS (ground GND). In the process, the potential difference between the differential input signals d and dx produces a difference between the currents flowing through the transistors 112 and 122. Thus, the nodes q and qx assume different values corresponding to the complementary inputs. The nodes q and qx function as both an input and an output of the cross-coupled first and second inverters. Therefore, a signal amplified to the level of the high potential power supply (source voltage AVD) or the low potential power supply (ground voltage AVS) corresponding to the differential input signals d, dx is produced and held in a latch unit.

In the case where the clock CK assumes low level "L", on the other hand, the transistor 130 turns off and the current path disappears. Also, the transistors 110 and 120 turn on, so that both the nodes q and qx assume the same potential as the source voltage. By applying this output voltage as an input to a SR latch, the differential input signals d, dx can be amplified in synchronism with the clock CK.

In this way, the conventional differential sense amplifier of strong arm latch type is used by cutting off the through current when the clock CK is at low level "L" or after the signal is established.

Figure 2:
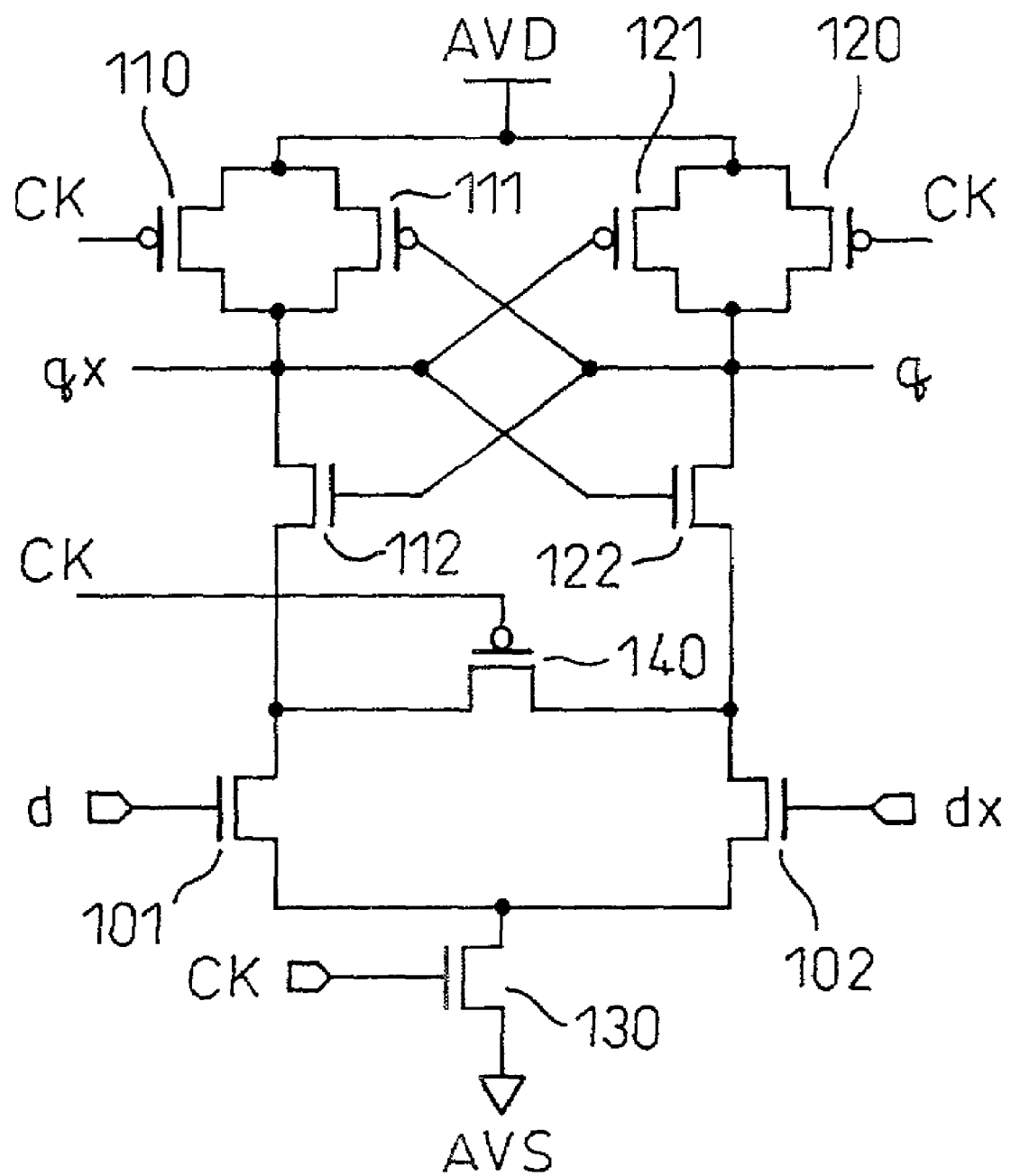
FIG. 2 is a circuit diagram for explaining another example of the conventional differential amplifier circuit.

FIG. 2 is a circuit diagram for explaining another example of the conventional differential amplifier circuit.

The differential amplifier circuit shown in FIG. 2 is different from the differential amplifier circuit of FIG. 1 in that a PMOS transistor 140 is inserted between the drains of the NMOS transistors 101, 102 having the gates thereof supplied with the differential input signals d, dx, respectively. The gate of the transistor 140 is supplied with the clock CK. When the clock CK is at low level "L", i.e. when the transistor 130 is off and the transistors 110, 120 are on, the drains of the transistors 101, 102 assume the same potential. As a result, the differential input transistors 101 and 102 can be maintained at a substantially equal potential when determining the signal by changing the clock CK from low level "L" to high level "H".

FIGS. 3 to 7 are circuit diagrams for explaining other examples of the conventional differential amplifier circuit.

Figure 3:
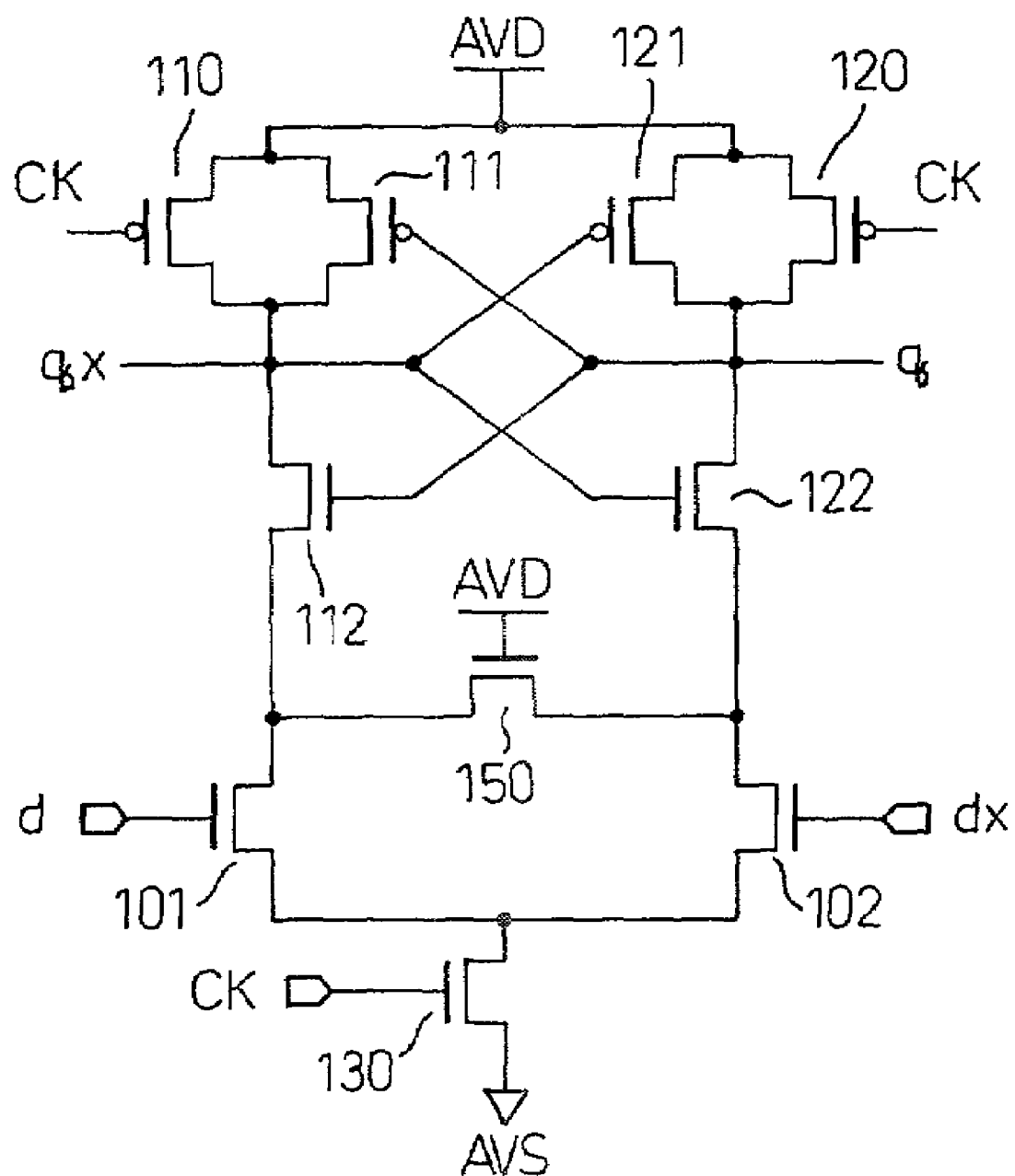
FIG. 3 is a circuit diagram for explaining still another example of the conventional differential amplifier circuit.

The differential amplifier circuit shown in FIG. 3 is different from the differential amplifier circuit shown in FIG. 1 in that a NMOS transistor 150 is inserted between the drains of the NMOS transistors 101 and 102 having the gates thereof supplied with the differential input signals d and dx, respectively. The differential input signals d, dx assume the CML (Current Mode Logic) level approximate to the high potential source voltage AVD, for example, and the gate of the transistor 150 is supplied with the high potential source voltage AVD. When the clock CK is at low level "L", i.e. when the transistor 130 is off while the transistors 110, 120 are on, therefore, the drains of the transistors 101, 102 assume substantially the same potential. When the clock CK is at high level "H", on the other hand, the gate of the transistor 150 is supplied with the high potential source voltage AVD. Since the potential difference between the source and drain of this transistor is not so high, however, the operation of differential amplification is not affected.

As a result, as in the differential amplifier circuit of FIG. 2, the differential input transistors 101 and 102 can be maintained at substantially the same potential when determining the signal by changing the clock CK from low level "L" to high level "H".

Figure 4:
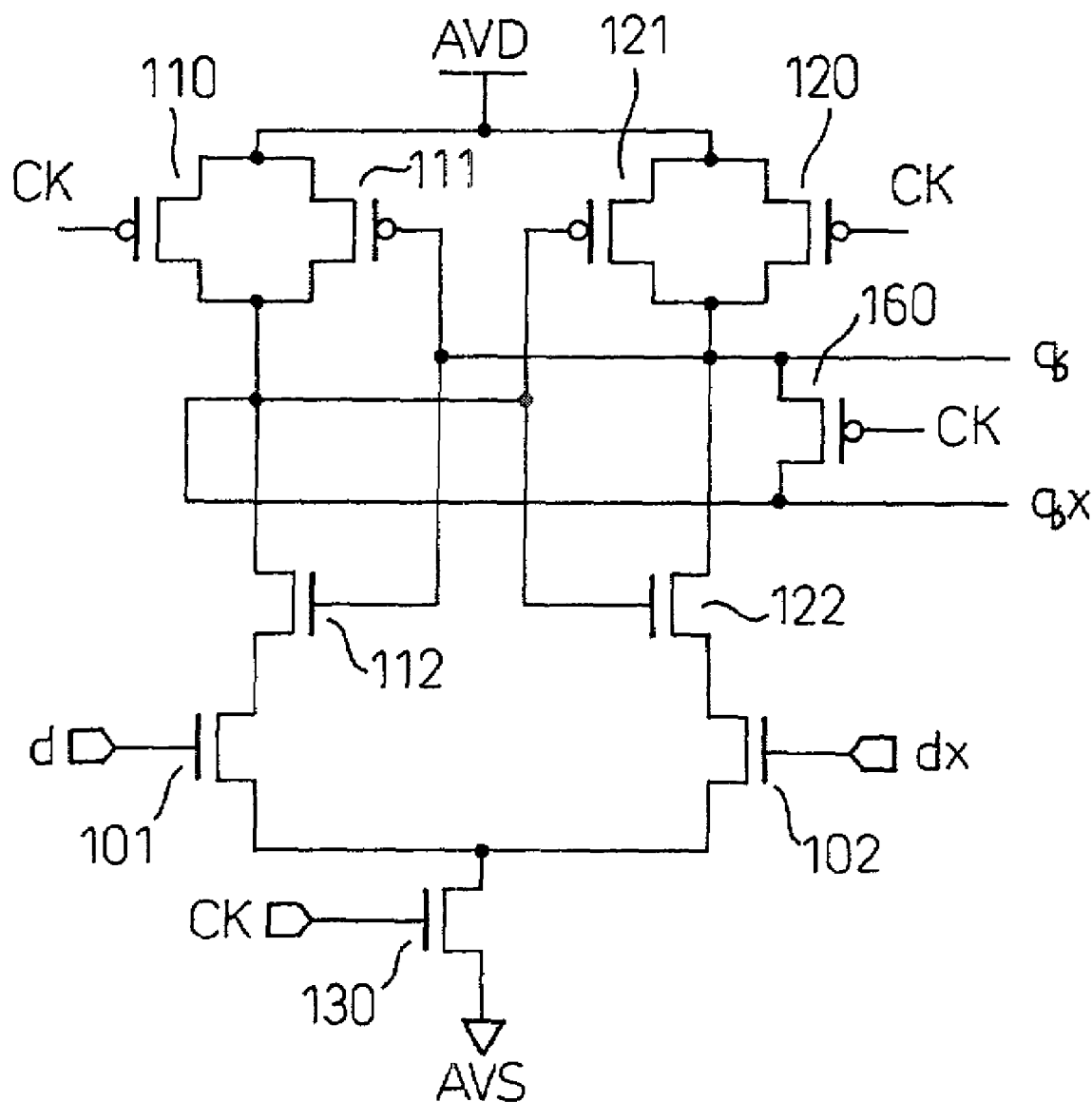
FIG. 4 is a circuit diagram for explaining yet another example of the conventional differential amplifier circuit.

The differential amplifier circuit shown in FIG. 4 is different from the differential amplifier circuit of FIG. 1 in that a NMOS transistor 160 having the gate thereof supplied with the clock CK is interposed between the differential outputs q and qx.

The gate of the transistor 160 is supplied with the clock CK. When the clock CK is at low level "L", i.e. when the transistor 130 is off while the transistors 110, 120 are on, the differential outputs (the input/output nodes of the cross-coupled first and second inverters) q and qx are maintained at the same potential. By thus maintaining the output nodes q and qx at the same potential when the clock CK is at low level "L", the cross-coupled portions of the first and second inverters can be maintained at substantially the same potential.

Figure 5:
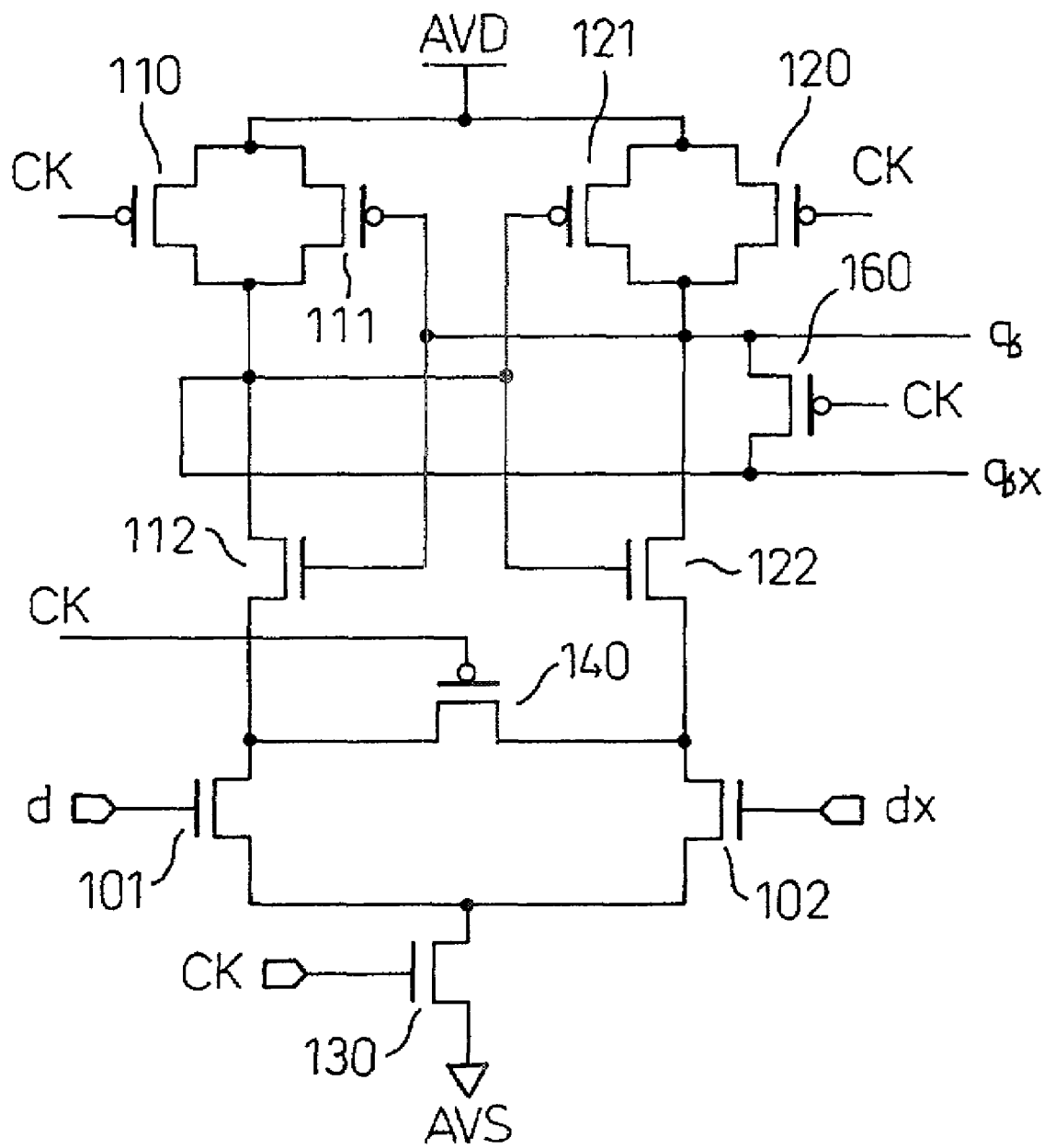
FIG. 5 is a circuit diagram for explaining a further example of the conventional differential amplifier circuit.
Figure 6:
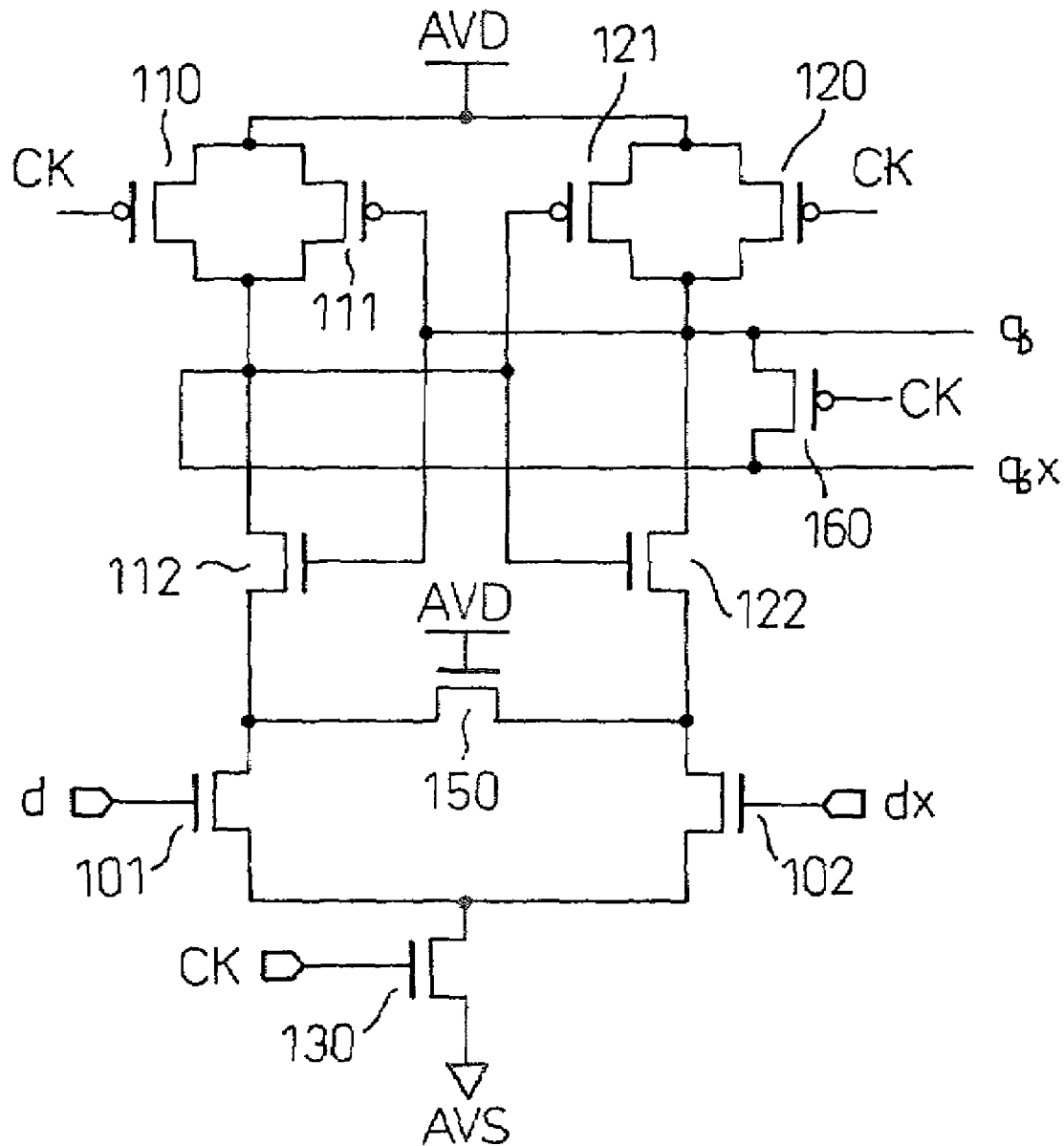
FIG. 6 is a circuit diagram for explaining a still further example of the conventional differential amplifier circuit.

The differential amplifier circuit shown in FIG. 5 is different from the differential amplifier circuit shown in FIG. 4 in the addition of the PMOS transistor 140 shown in FIG. 2. The differential amplifier circuit shown in FIG. 6, on the other hand, is different from the differential amplifier circuit shown in FIG. 4 in the addition of the NMOS transistor 150 shown in FIG. 3.

Figure 7:
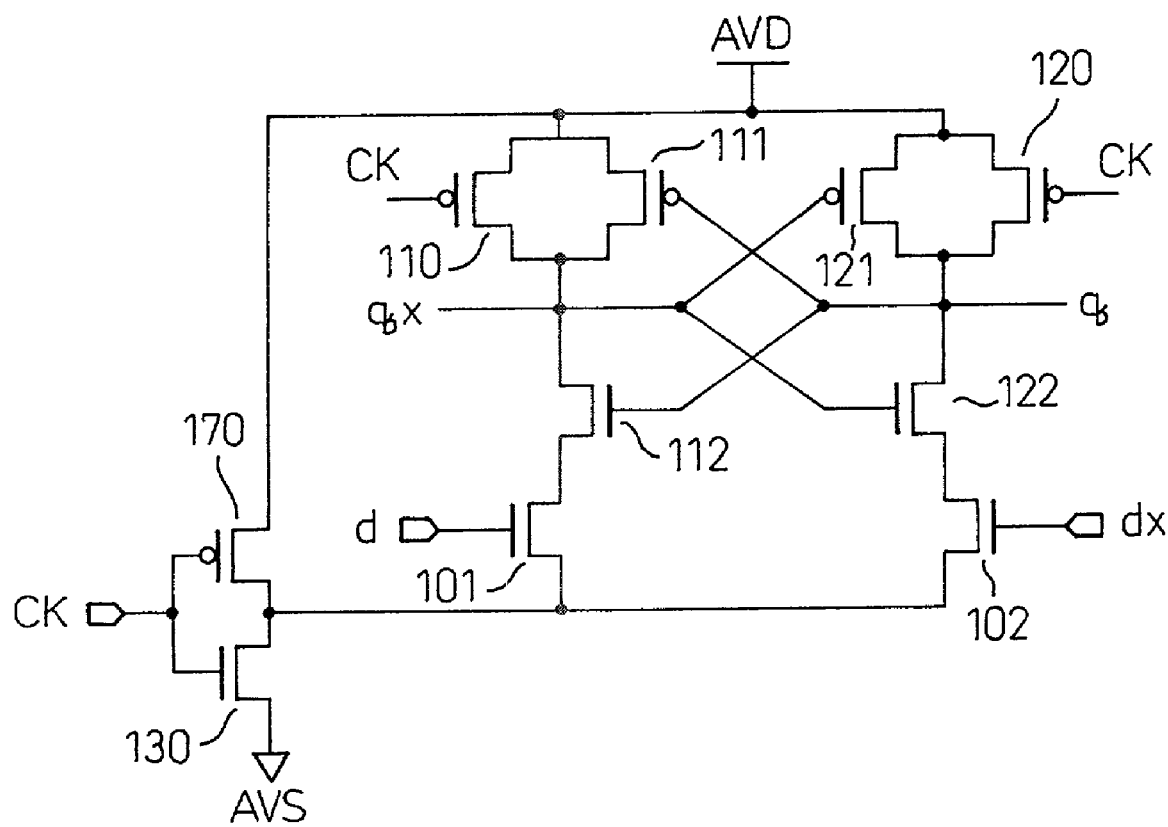
FIG. 7 is a circuit diagram for explaining a yet further example of the conventional differential amplifier circuit.

The differential amplifier circuit shown in FIG. 7 is different from the differential amplifier circuit shown in FIG. 1 in that a PMOS transistor 170 with the clock CK supplied to the gate thereof is inserted between the sources of the PMOS transistors 110, 120 (high potential source voltage AVD) and the drain of the NMOS transistor 130 (the sources of the differential input transistors 101, 102). As a result, when the clock CK is reduced from high level "H" to low level "L" and each node potential is about to return to the initial value, the transistor 170 turns on and the high potential source voltage AVD is applied to the sources side of the differential input transistors, thereby shortening the time required for initialization.

In the case where the signal (differential input signal) is high in speed or supplied through a transmission path or the like, the resultant large attenuation of the signal reduces the differential amplitude of the differential input signals d, dx. With the small signal amplitude, the potential difference between the nodes q, qx in FIGS. 1 and 2 is reduced. As a result, a faulty operation is liable to occur under the effect of an offset which may be caused by the asymmetry of the circuit layout or the offset due to the variations of the manufacturing process of the differential input transistors 101, 102 supplied with the differential input signal. Also, at the time of signal determination, an extraneous time is required to charge the parasitic capacitance, and it takes time to establish the potential of the node q, qx, thereby making it impossible to follow the high-speed signal change. Further, when the clock CK is changed from low level "L" to high level "H" and the transistor 130 turns on so that the sources of the differential input transistors 101, 102 are pulled toward the low potential power supply, the level of the gate signals (differential input signals d, dx) of the particular differential input transistor may undergo a change to cause a faulty operation.

Now, a differential amplifier circuit and a semiconductor integrated circuit device according to embodiments of the invention will be described in detail below with reference to the accompanying drawings.

Figure 8:
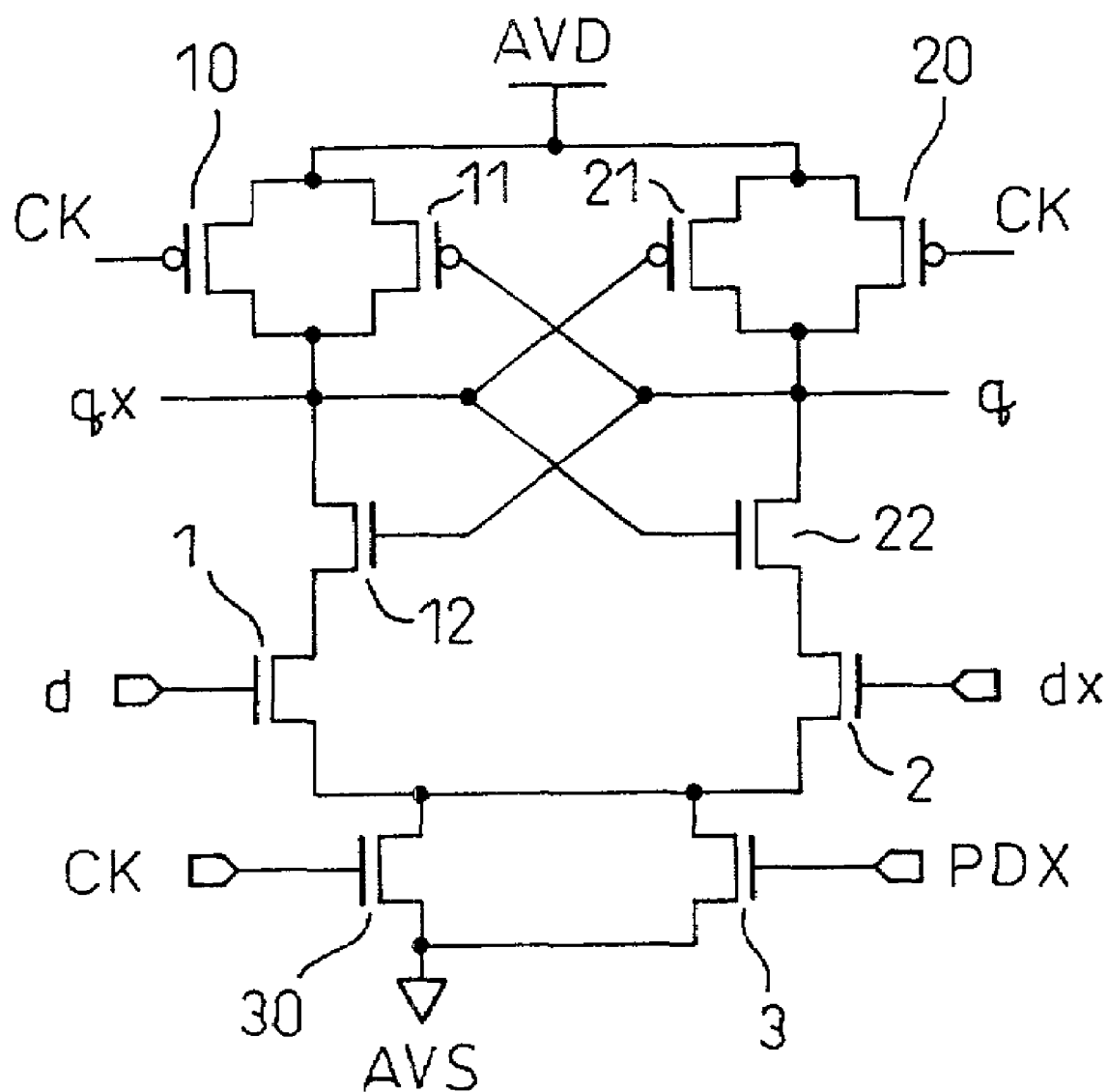
FIG. 8 is a circuit diagram showing a differential amplifier circuit according to a first embodiment of the invention.

FIG. 8 is a circuit diagram showing a differential amplifier circuit according to a first embodiment of the invention, which is a differential sense amplifier circuit of strong arm latch type including CMOS transistors.

In FIG. 8, reference character AVD designates a high potential power line, character AVS a low potential power line, reference numerals 1, 2, 3, 12, 22, 30 N-channel MOS transistors (NMOS transistors), and numerals 10, 11, 20, 21 P-channel MOS transistors (PMOS transistors). Character CK designates a clock, characters d, dx differential input signals (complementary input signals) and characters q, qx differential output signals (complementary output signals, complementary output nodes). The transistors 11, 12 make up a first inverter, and the transistors 21, 22 make up a second inverter. The first and second inverters constitute a cross-coupled latch unit.

The source of the input transistor 1 having the gate thereof supplied with the input signal d and the source of the input transistor 2 having the gate thereof supplied with the input signal dx are connected to a common terminal on the one hand, and connected to the low potential power line AVS through the transistors 3 and 30 on the other hand. The gate of the transistor 30 is supplied with the clock CK, and the gate of the transistor 3 is supplied with a control signal PDX.

The drain of the input transistor 1 is connected to the high potential power line AVD through the first inverter (transistors 11, 12). In similar fashion, the drain of the input transistor 2 is connected to the high potential power line AVD through the second inverter (transistors 21, 22). The PMOS transistors 11, 21 making up the inverters are connected in parallel to the PMOS transistors 10, 20, respectively, each having the gate thereof supplied with the clock CK.

As described above, the differential amplifier circuit (the differential sense amplifier circuit of strong arm latch type) according to the first embodiment shown in FIG. 8 is different from the conventional differential amplifier circuit shown in FIG. 1 in the addition of the NMOS transistor 3 having the gate thereof supplied with the control signal PDX.

Figure 9:
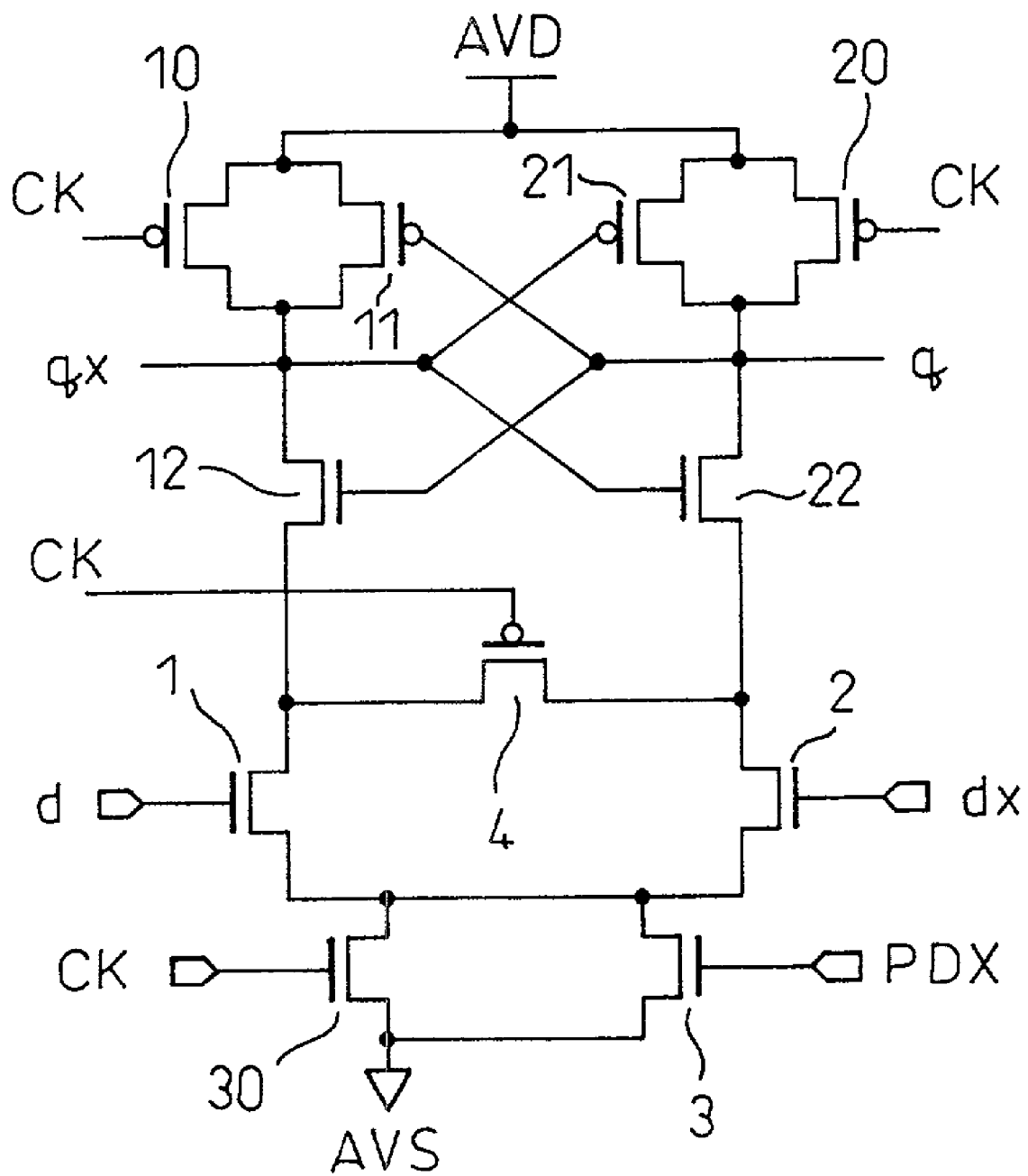
FIG. 9 is a circuit diagram showing a differential amplifier circuit according to a second embodiment of the invention.

FIG. 9 is a circuit diagram showing a differential amplifier circuit according to a second embodiment of the invention. This differential amplifier circuit is different from the differential amplifier circuit according to the first embodiment shown in FIG. 8 in that a PMOS transistor 4 is interposed between the drains of the NMOS transistors 1 and 2 having the gates thereof supplied with the differential input signals d, dx, respectively. Specifically, the differential amplifier circuit (differential sense amplifier circuit of strong arm latch type) according to the second embodiment shown in FIG. 9 is different from the conventional differential amplifier circuit shown in FIG. 2 in the addition of the PMOS transistor 4 having the gate thereof supplied with the clock CK.

FIG. 10 is a timing chart for explaining the operation of the differential amplifier circuits shown in FIGS. 8 and 9.

In the first and second embodiments, the transistor 3 is configured in a so small a size that the width of the gate thereof is about one thirtieth of the gate width of the transistor 30 turned on for driving the differential amplifier circuit when the clock CK rises to high level "H". As a result, even when no driving current is flowing in the circuit as the clock CK is at low level "L" with the transistor 30 turned off, the transistor 3 turns on and permits a minute current to flow in the circuit (differential input transistors 1 and 2). The clock CK changes from low level "L" to high level "H" to amplify (determine) the data D at substantially the central portion of the data D (differential input signals d, dx).

In the differential amplifier circuits according to the first and second embodiments shown in FIGS. 8 and 9, the control signal PDX rises to high level "H" and the transistor 3 turns on when the differential amplifier circuit (the semiconductor integrated circuit device having the differential amplifier circuit) is in operation. In the process, the clock CK is at low level "L", the transistor 30 is off while the transistors 10, 20 are on, so that a current path is formed in the circuit through the transistor 3, and thus a minute current flows through the circuit. Specifically, the transistor 3 is configured as a small transistor having a gate width about one thirtieth the gate width of the transistor 30. Therefore, a minute current flows constantly in the differential input transistors 1 and 2. The differential input transistors 1 and 2 of course perform the amplification operation even when a minute current is flowing through the circuit due to the transistor 3.

According to the second embodiment shown in FIG. 9, the drains of the transistors 1 and 2 are maintained at the same potential by the transistor 4 having the gate thereof supplied with the clock CK when the clock CK is at low level "L", i.e. when the transistor 30 is off while the transistors 10 and 20 are on. As a result, the differential input transistors 1 and 2 are maintained at substantially the same potential when the signal is determined by changing the clock CK from low level "L" to high level "H".

For signal determination, when the clock CK changes from low level "L" to high level "H", the transistor 30 turns on and a current path is formed from the high potential power line AVD to the low potential power line AVS (ground GND) and the drive current flows. At the same time, the potential difference between the differential input signals d, dx causes the difference of the current flowing in the transistors 12 and 22. Therefore, the potentials of the nodes q, qx assume different values corresponding to the complementary input. The nodes q, qx constitute both an input and an output of the cross-coupled first and second inverters. In response to the differential input signals d, dx, a signal amplified to the level of the high potential power supply (source voltage AVD) or the low potential power supply (ground voltage AVS) is produced and held in the latch unit.

Specifically, at the rise timing of the clock CK, for example, the data D0 (differential input signals d, dx) are retrieved, and the corresponding output signals (nodes q, qx) are output by being held in the latch unit.

By keeping a current flow through the differential amplifier circuit of strong arm latch type as described above, the parasitic capacitance is charged in advance so that the effect of variations due to the difference in the parasitic capacitance can be suppressed. Also, since the current is constantly flowing in the circuit, the source potential of the transistors 2, 3 is increased, thereby improving the switching rate when the clock CK turns from low level "L" to high level "H".

Figure 11A:
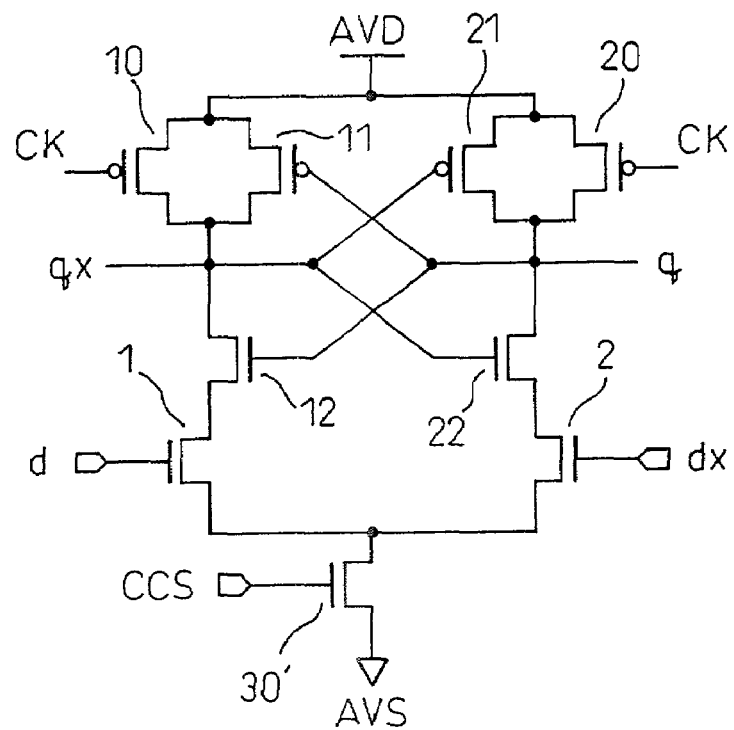
FIGS. 11A and 11B are circuit diagrams showing differential amplifier circuits according to a third embodiment of the invention.
Figure 11B:
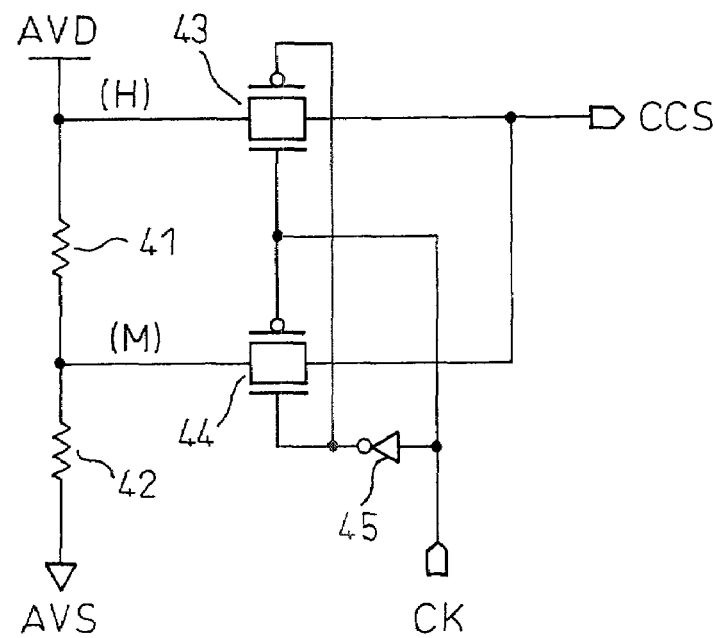

FIGS. 11A, 11B are diagrams showing a differential amplifier circuit according to the third embodiment of the invention, in which FIG. 11A is a circuit diagram showing the differential amplifier circuit, and FIG. 11B a diagram showing a circuit for generating a current control signal.

As shown in FIG. 11A, the third embodiment corresponds to the differential amplifier circuit according to the first embodiment shown in FIG. 8, in which the transistor 30 doubles as the transistor 3. The circuit configuration of the third embodiment corresponds to that of the differential amplifier circuit of FIG. 1. In the third embodiment, however, the gate of the transistor 30' is supplied with the current control signal CCS.

The current control signal CCS is generated by a circuit such as shown in FIG. 11B. In FIG. 11B, reference numerals 41, 42 designate resistor means, numerals 43, 44 transfer gates, and numeral 45 an inverter.

The input terminal of the transfer gate 43 is supplied with a high potential source voltage (high level "H"), and the input terminal of the transfer gate 44 is supplied with a voltage of intermediate level (intermediate level "M") obtained by division in the resistor means 41 and 42. The transfer gates 43, 44 are controlled by the clock CK in such a manner that one of them is in off state while the other is in on state. Specifically, when the clock CK is at high level "H", the transfer gate 43 turns on and the current control signal CCS rises to high level "H", while when the clock CK is at low level "L", the transfer gate 44 turns on and the current control signal CCS assumes an intermediate level "M".

Figure 12:
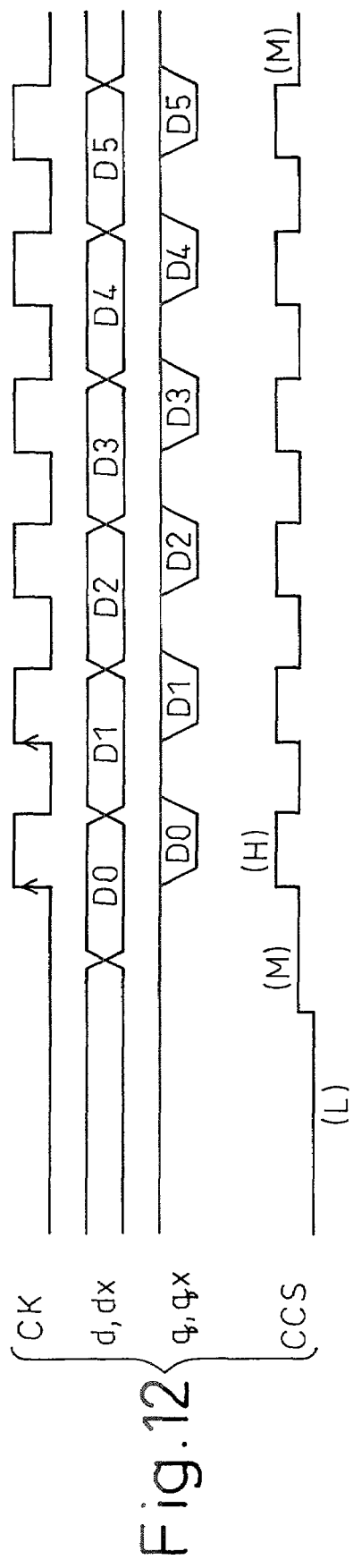
FIG. 12 is a timing chart for explaining the operation of the differential amplifier circuit shown in FIG. 11A.

FIG. 12 is a timing chart for explaining the operation of the differential amplifier circuit shown in FIG. 11A.

In the timing chart of FIG. 12, the current control signal CCS supplied to the gate of the transistor 30' assumes one of three levels. When the differential amplifier circuit (the receiving circuit or the semiconductor integrated circuit device including the differential amplifier circuit) is out of operation, the current control signal CCS assumes low level "L" and turns off the transistor 30' thereby to prevent the minute current from flowing through the differential input transistors 1 and 2.

The high level "H" of the current control signal CCS is similar to the high level of the clock CK. By supplying a signal of high level "H" to the gate of the transistor 30' at the same timing as the clock CK, a drive current is supplied to the circuit in a manner similar to the way the drive current is supplied to the transistor 30 in the first and second embodiments described above. Also, at the timing when the clock CK is reduced to low level "L", the gate of the transistor 30' is supplied with the current control signal CCS of intermediate level "M", and a minute current is supplied to the circuit (differential input transistors 1 and 2) through the transistor 30'.

Also in the third embodiment, as in the second embodiment described above, the PMOS transistor 4 having the gate thereof supplied with the clock CK may be inserted between the drains of the differential input transistors 1 and 2.

Figure 13:
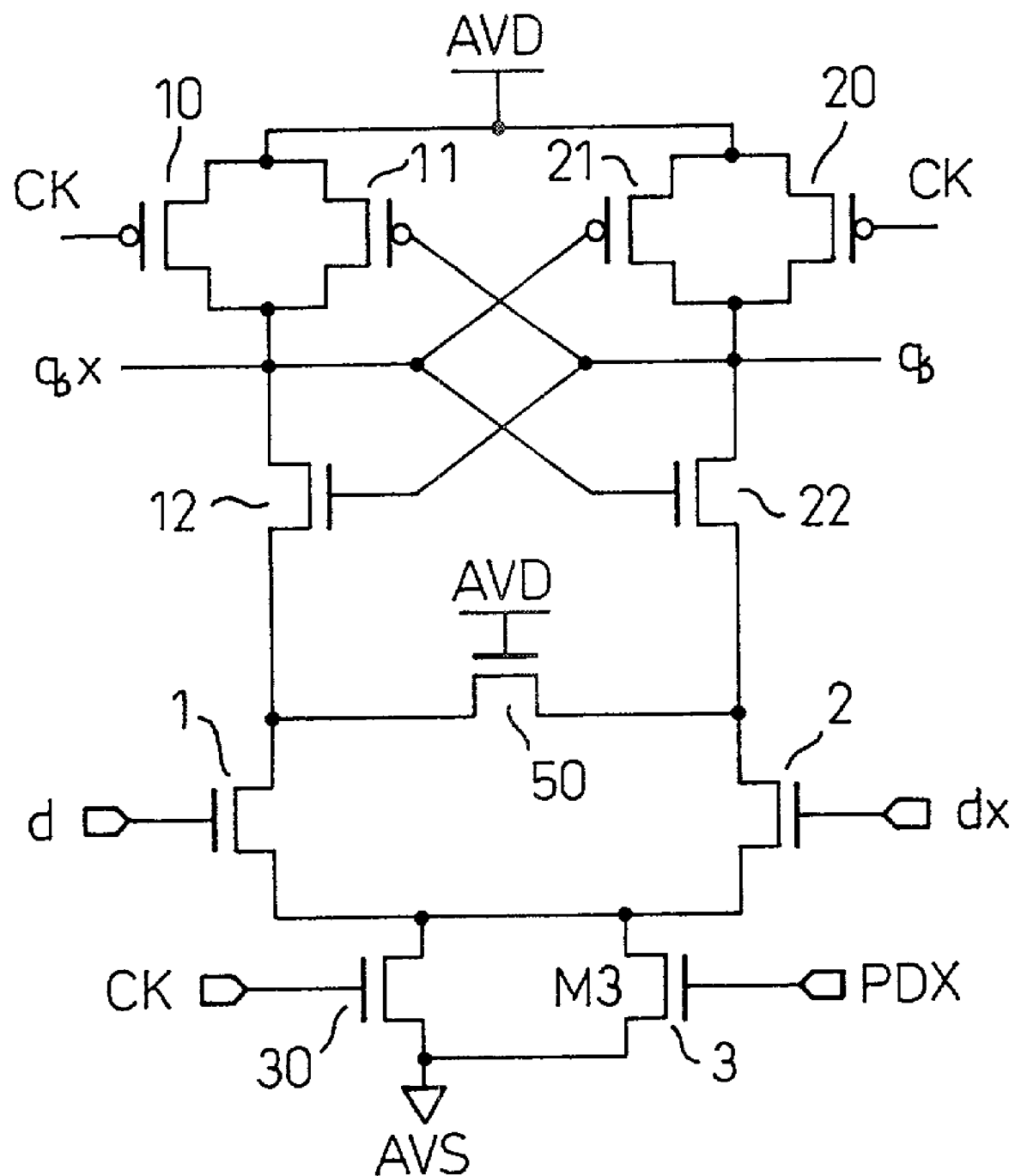
FIG. 13 is a circuit diagram showing a differential amplifier circuit according to a fourth embodiment of the invention.

FIG. 13 is a circuit diagram showing a differential amplifier circuit according to a fourth embodiment of the invention.

The differential amplifier circuit according to the fourth embodiment shown in FIG. 13 is different from the differential amplifier circuit according to the first embodiment shown in FIG. 8 in that a NMOS transistor 50 is inserted between the drains of the NMOS transistors 1 and 2 having the gates thereof supplied with the differential input signals d, dx. The differential input signals d, dx assume a CML level approximate to the high potential source voltage AVD, for example. Also, in view of the fact that the gate of the transistor 50 is supplied with the high potential source voltage AVD, the drains of the transistors 1 and 2 assume substantially the same potential when the clock CK is at low level "L", i.e. when the transistor 30 is off while the transistors 10 and 20 are on. When the clock CK is at high level "H", on the other hand, the potential of the source and the drain of the transistor 50 drops after the differential outputs q, qx are established. Thus, the transistor 50 is turned on by the high potential source voltage AVD applied to the gate thereof. Since the differential outputs q, qx are already established, however, the operation of differential amplification is not affected.

Also in the fourth embodiment, the transistor 3 having the gate thereof supplied with the control signal PDX is configured as a small-sized transistor. Even in the case where the clock CK is at low level "L" and no drive current is flowing in the circuit as the transistor 30 is in off in state, the transistor 3 turns on to keep a minute current flowing through the circuit (differential input transistors 1 and 2). The operation of this transistor 3 is similar to that of the first and second embodiments described above.

Figure 14:
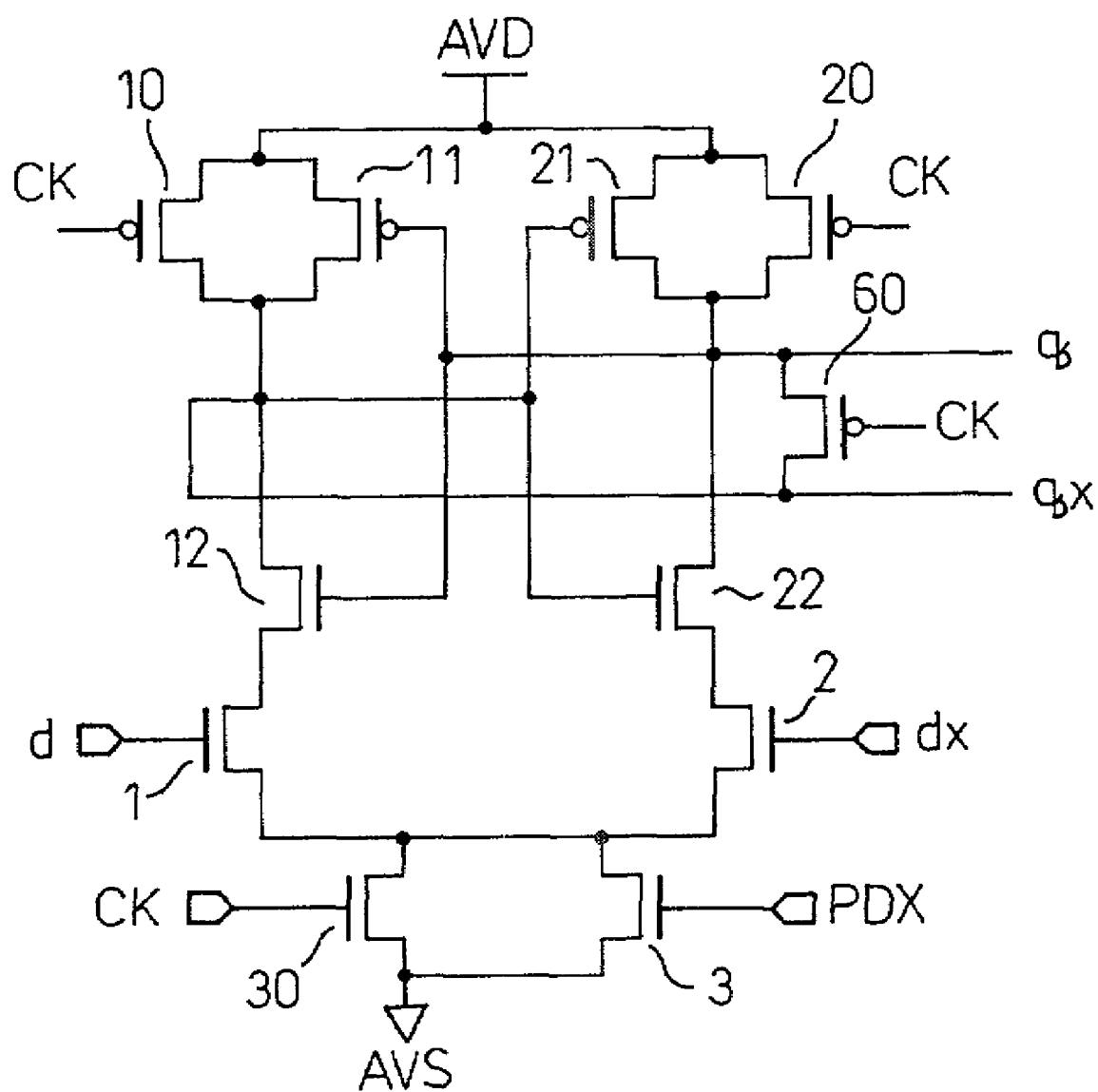
FIG. 14 is a circuit diagram showing a differential amplifier circuit according to a fifth embodiment of the invention.

FIG. 14 is a circuit diagram showing a differential amplifier circuit according to a fifth embodiment of the invention.

The differential amplifier circuit according to the fifth embodiment shown in FIG. 14 is different from the differential amplifier circuit according to the first embodiment in that a NMOS transistor 60 having the gate thereof supplied with the clock CK is inserted between the differential outputs q and qx.

The gate of the transistor 60 is supplied with the clock CK, and when the clock CK is at low level "L", i.e. when the transistor 30 is off while the transistors 10, 20 are on, the differential outputs q, qx are maintained at the same potential. By thus maintaining the output nodes q, qx at the same potential when the clock CK is at low level "L" as described above, the cross-coupled portions of the first and second inverters can be maintained at substantially the same potential.

Figure 15:
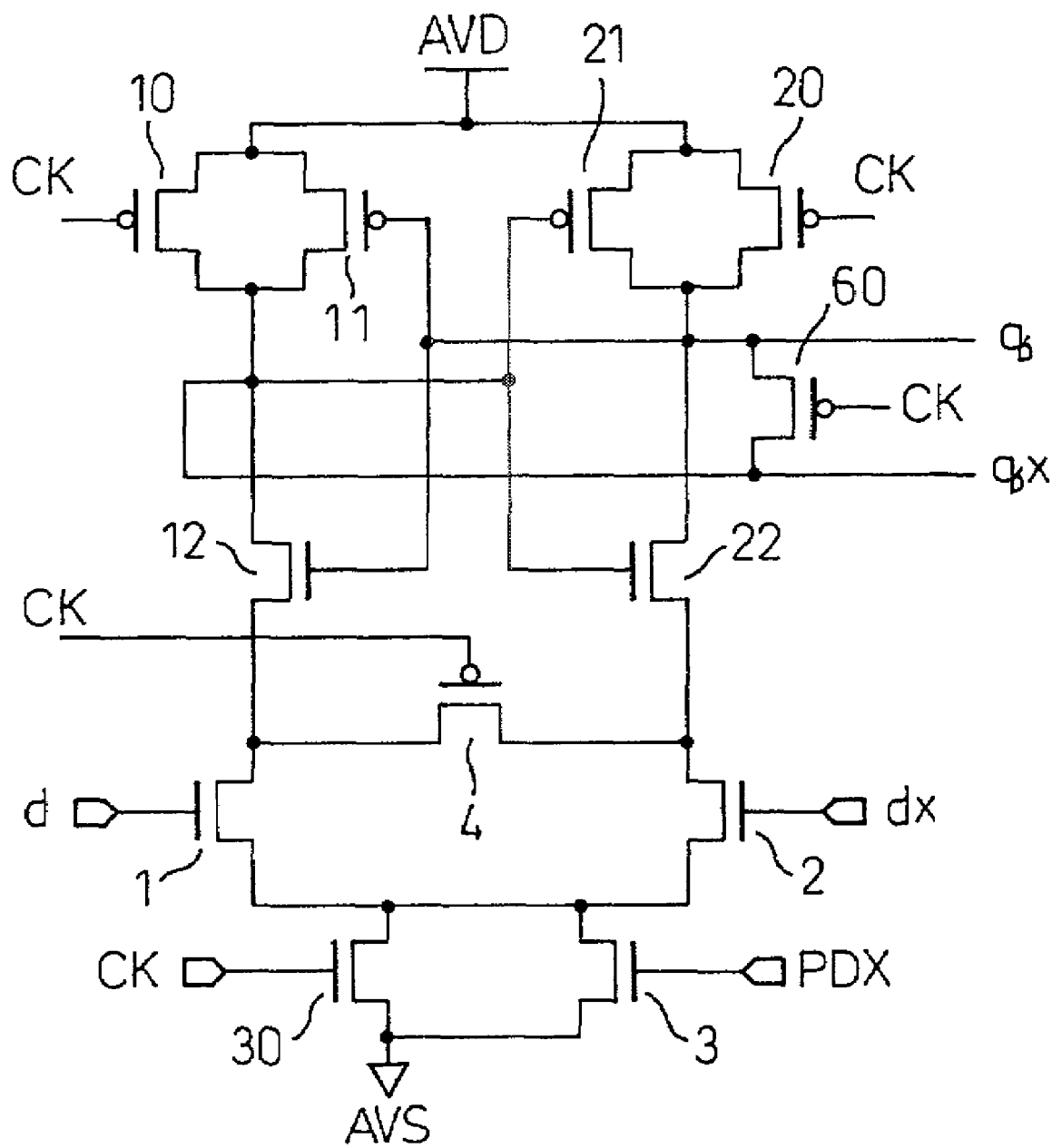
FIG. 15 is a circuit diagram showing a differential amplifier circuit according to a sixth embodiment of the invention.
Figure 16:
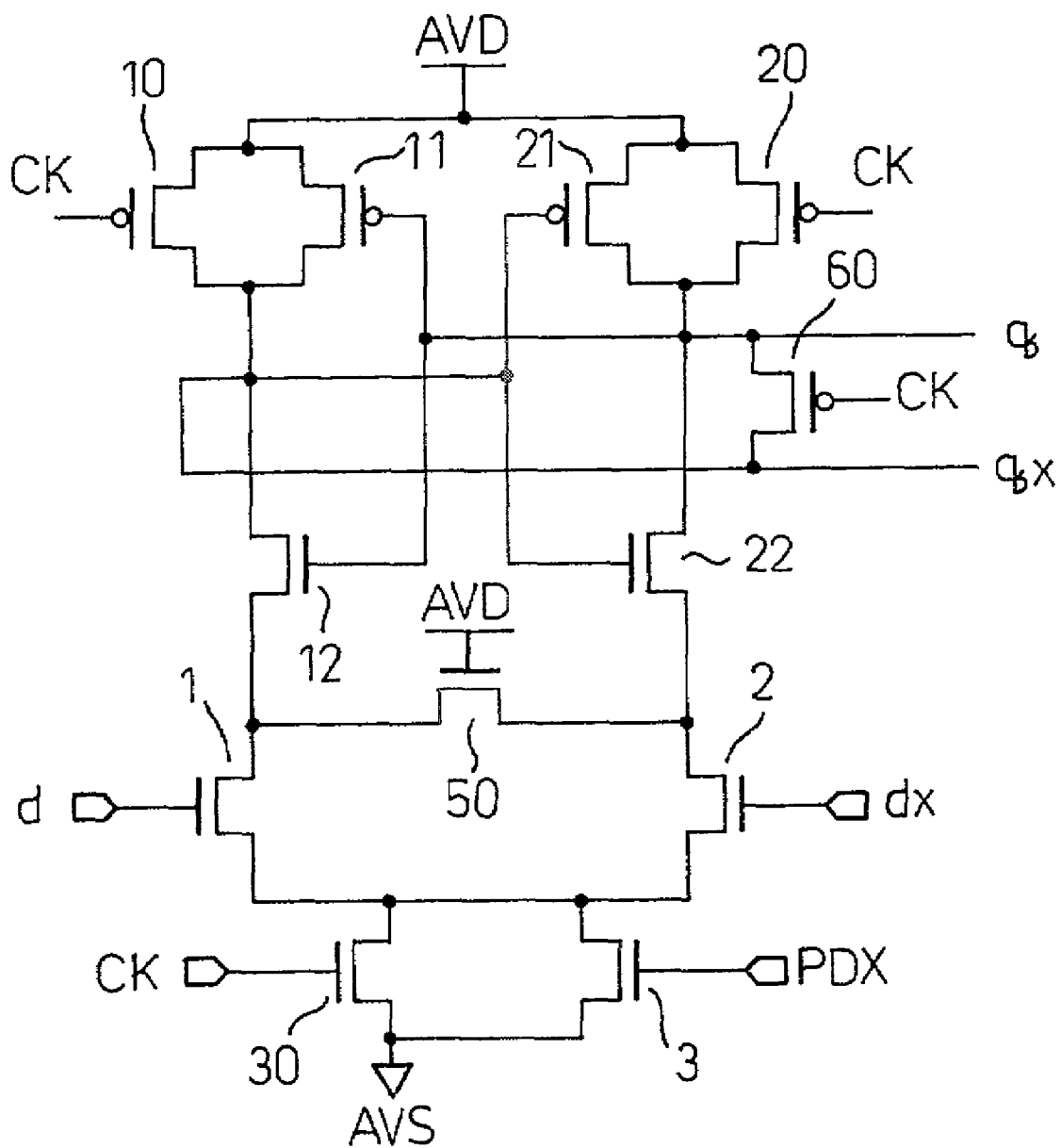
FIG. 16 is a circuit diagram showing a differential amplifier circuit according to a seventh embodiment of the invention.

FIG. 15 is a circuit diagram showing a differential amplifier circuit according to a sixth embodiment of the invention, and FIG. 16 is a circuit diagram showing a differential amplifier circuit according to a seventh embodiment of the invention.

The differential amplifier circuit according to the sixth embodiment shown in FIG. 15 is different from the differential amplifier circuit according to the fifth embodiment in the provision of the PMOS transistor 4 according to the second embodiment shown in FIG. 9. On the other hand, the differential amplifier circuit according to the seventh embodiment shown in FIG. 16 is different from the differential amplifier circuit according to the fifth embodiment in the provision of the PMOS transistor 50 according to the fourth embodiment shown in FIG. 13.

Figure 17:
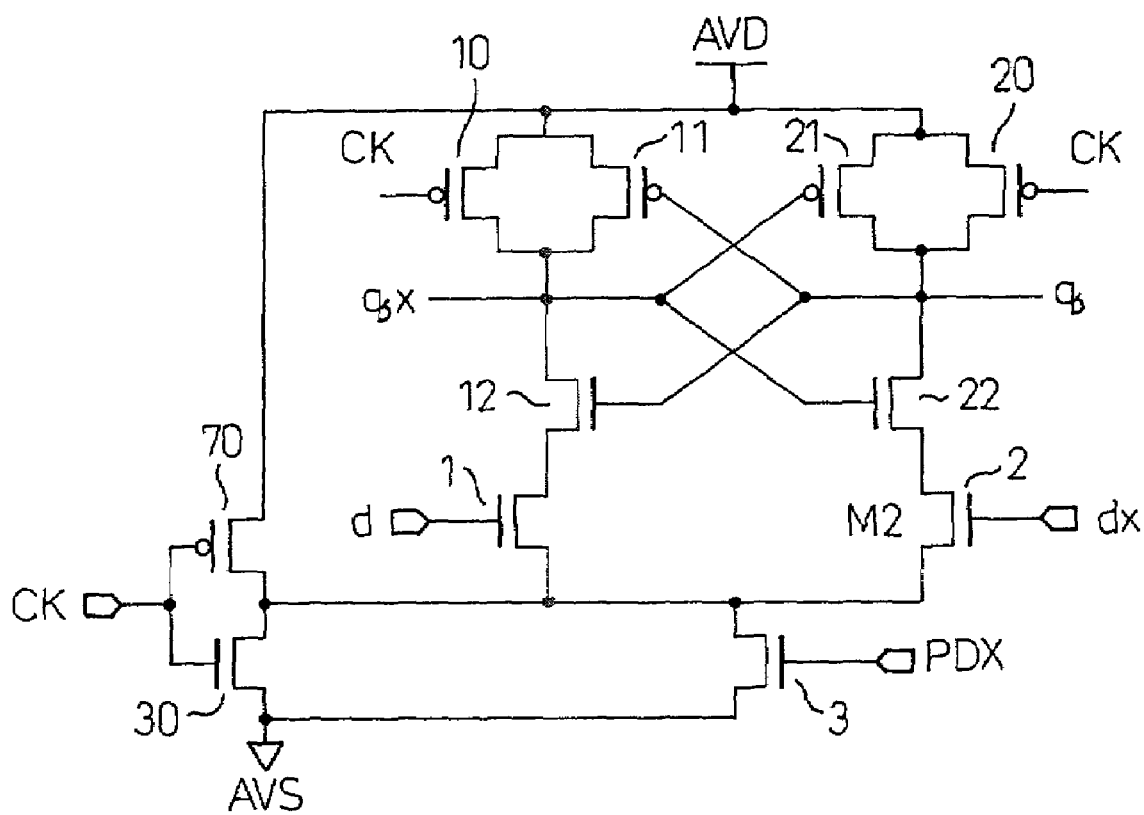
FIG. 17 is a circuit diagram showing a differential amplifier circuit according to an eighth embodiment of the invention.

FIG. 17 is a circuit diagram showing a differential amplifier circuit according to an eighth embodiment of the invention.

The differential amplifier circuit according to the eighth embodiment shown in FIG. 7 is different from the differential amplifier circuit according to the first embodiment shown in FIG. 8 in that a PMOS transistor 70 having the gate thereof supplied with the clock CK is inserted between the high potential source voltage AVD and the drain (the sources of the differential input transistors 1, 2) of the NMOS transistor 30 (NMOS transistor 3). As a result, when the clock CK turns from high level "H" to low level "L" and each node potential is returning to the initial value, the transistor 70 turns on so that the high potential source voltage AVD is applied to the sources of the differential input transistors, thereby making it possible to shorten the time required for initialization.

The fourth to eighth embodiments described above, like the third embodiment shown in FIG. 11A, can also be so configured that a single transistor 30' having the gate thereof supplied with the current control signal CCS functions as both the transistor 30 and the transistor 3.

As described above, the differential amplifier circuit according to each of the embodiments of the invention, as compared with the conventional differential amplifier circuit (FIGS. 1 to 7), can accurately read (determine) the signal having a smaller differential amplitude. Also, even in the case where the signal transmission path is short or the signal is less attenuated, the durability against the clock jitter can be improved since the amplitude of a rising signal can be read.

Figure 18:
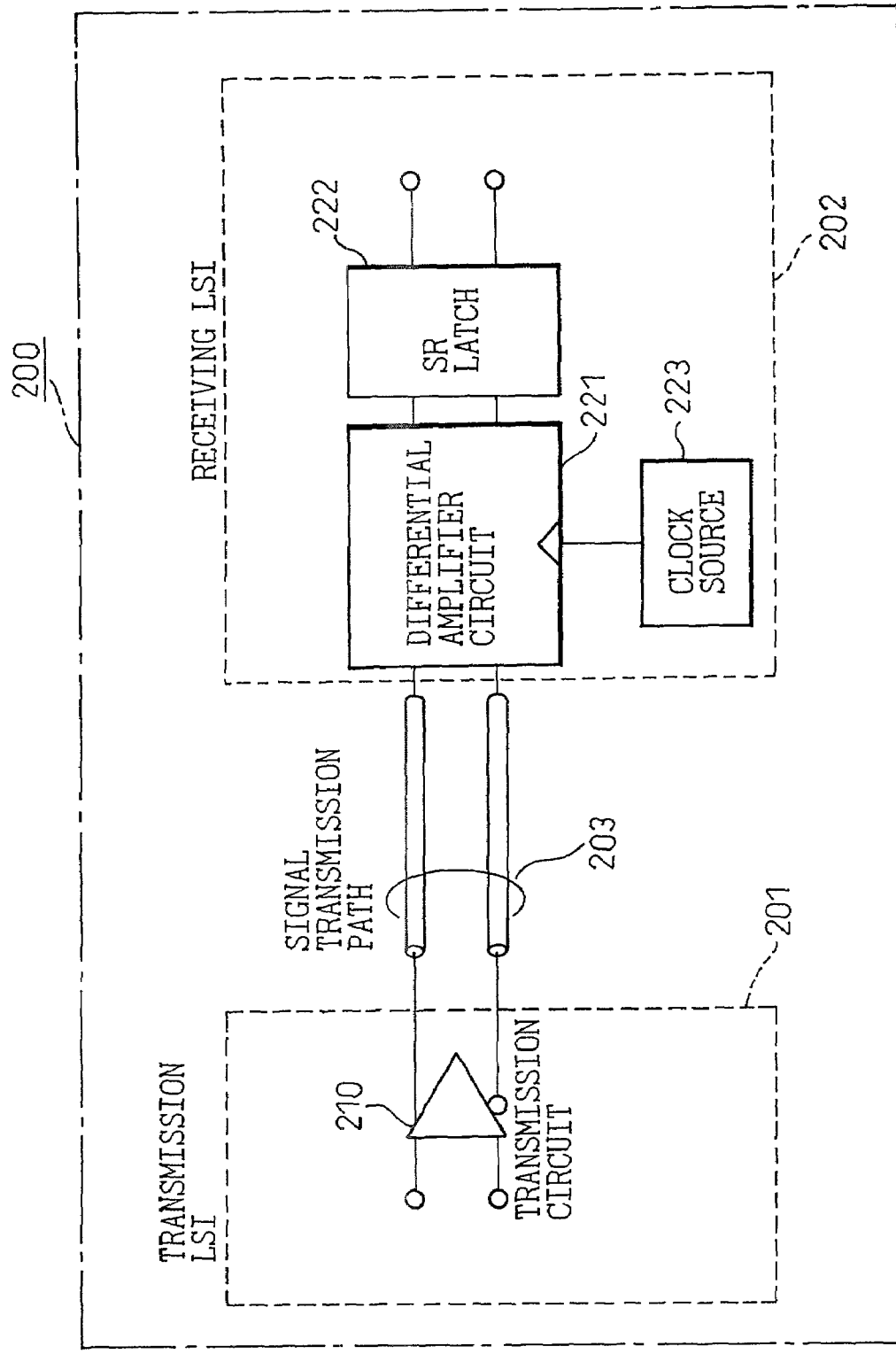
FIG. 18 is a block diagram showing an example of a signal transmission system to which a differential amplifier circuit according to the invention is applicable.

FIG. 18 is a block diagram showing an example of a signal transmission system (the circuit configuration of the receiving interface) for a differential amplifier circuit according to the invention. In FIG. 18, numeral 200 designates a circuit board, numeral 201 a transmission LSI, numeral 202 a receiving LSI and numeral 203 a signal transmission path. Numeral 210 designates a transmission circuit (driver circuit), numeral 221 designates a differential amplifier circuit according to the invention, numeral 222 a SR latch, and numeral 223 a clock source.

As shown in FIG. 18, the circuit configuration of the receiving interface between the transmission LSI 201 and the receiving LSI 202 mounted on the circuit board 200 capable of saving the length of the signal transmission path 203 has only a small high frequency loss of the signal for the short-distance transmission. Therefore, the signal (differential signal) output from the transmission LSI 201 is supplied directly to the input (differential inputs d, dx) of the differential amplifier circuit 221 of the receiving LSI 202 through the signal transmission path 203, and the output (determination output q, qx) of the differential amplifier circuit 221 is output through the SR latch 222. The clock source 223 is for generating a clock by processing the boundary of the data supplied thereto through the signal transmission path 203, for example, and the output thereof (clock CK) is supplied also to the differential amplifier circuit 221.

Figure 19:
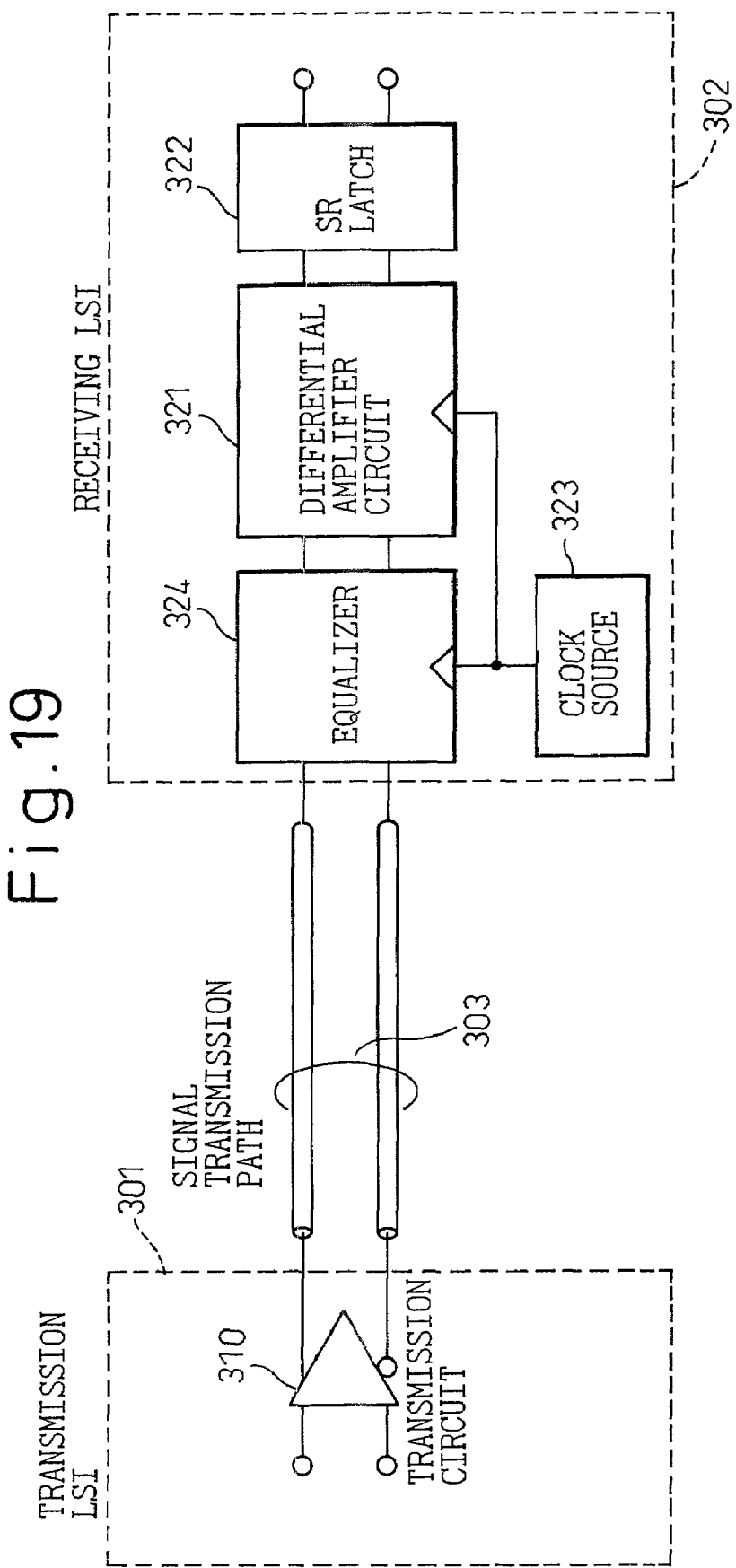
FIG. 19 is a block diagram showing another example of a signal transmission system to which a differential amplifier circuit according to the invention is applicable.

FIG. 19 is a block diagram showing another example of a signal transmission system using the differential amplifier circuit according to the invention. In FIG. 19, numeral 301 designates a transmission LSI, numeral 302 a receiving LSI, and numeral 303 a signal transmission path. Reference numeral 310 designates a transmission circuit, numeral 321 a differential amplifier circuit, numeral 322 a SR latch, numeral 324 a clock source, and numeral 324 an equalizer (LSI equalizer). In FIG. 19, the transmission LSI 301 and the receiving LSI 302 are arranged on different circuit boards (or in different housings) so that the signal can be transmitted through the signal transmission path 303 sufficiently longer than the signal transmission path 203 of the signal transmission system of FIG. 18 described above.

As shown in FIG. 19, when transmitting the signal over a long distance by the signal transmission path 303, the signal (differential signal) output from the transmission LSI 301 is reduced in the level difference of the differential signal due to the large high frequency loss. The signal from the signal transmission path 303, therefore, is supplied to the input (differential inputs d, dx) of the differential amplifier circuit 321 through the equalizer 324. Further, the output (determination outputs q, qx) of the differential amplifier circuit 321 is output through the SR latch 322. The clock source 323 is for generating a clock by processing the boundary of the data supplied through the signal transmission path 303, for example, and the output thereof (clock CK) is supplied also to the equalizer 324 and the differential amplifier circuit 321.

Figure 20:
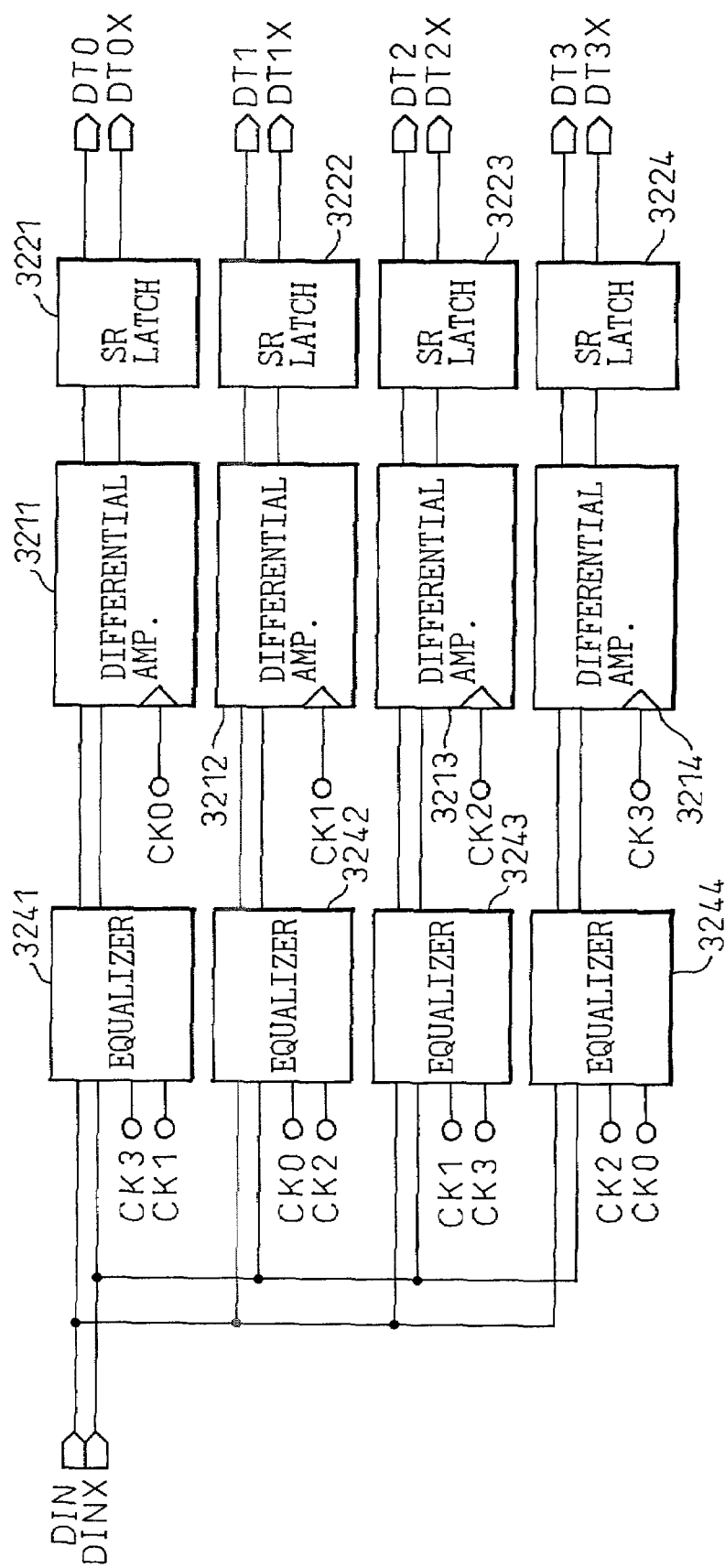
FIG. 20 is a block diagram showing an example configuration of a receiving LSI of the signal transmission system of FIG. 19.

FIG. 20 is a block diagram showing a configuration example of the receiving LSI (302) of the signal transmission system shown in FIG. 19. This receiving LSI represents a 4-way interleave-type DPRD (Differential Partial Response Detection) receiver. In FIG. 20, numerals 3211 to 3214 designate differential amplifier circuits corresponding to the respective embodiments described above, numerals 3221 to 3224 SR latches, and numerals 3241 to 3244 equalizers. Reference characters CK0 to CK3 designate four-phase clocks 90 degrees out of phase with each other, characters DIN, DINX differential input signals, and character sets of DT0, DT0X to DT3, DT3X differential output data.

Figure 21:
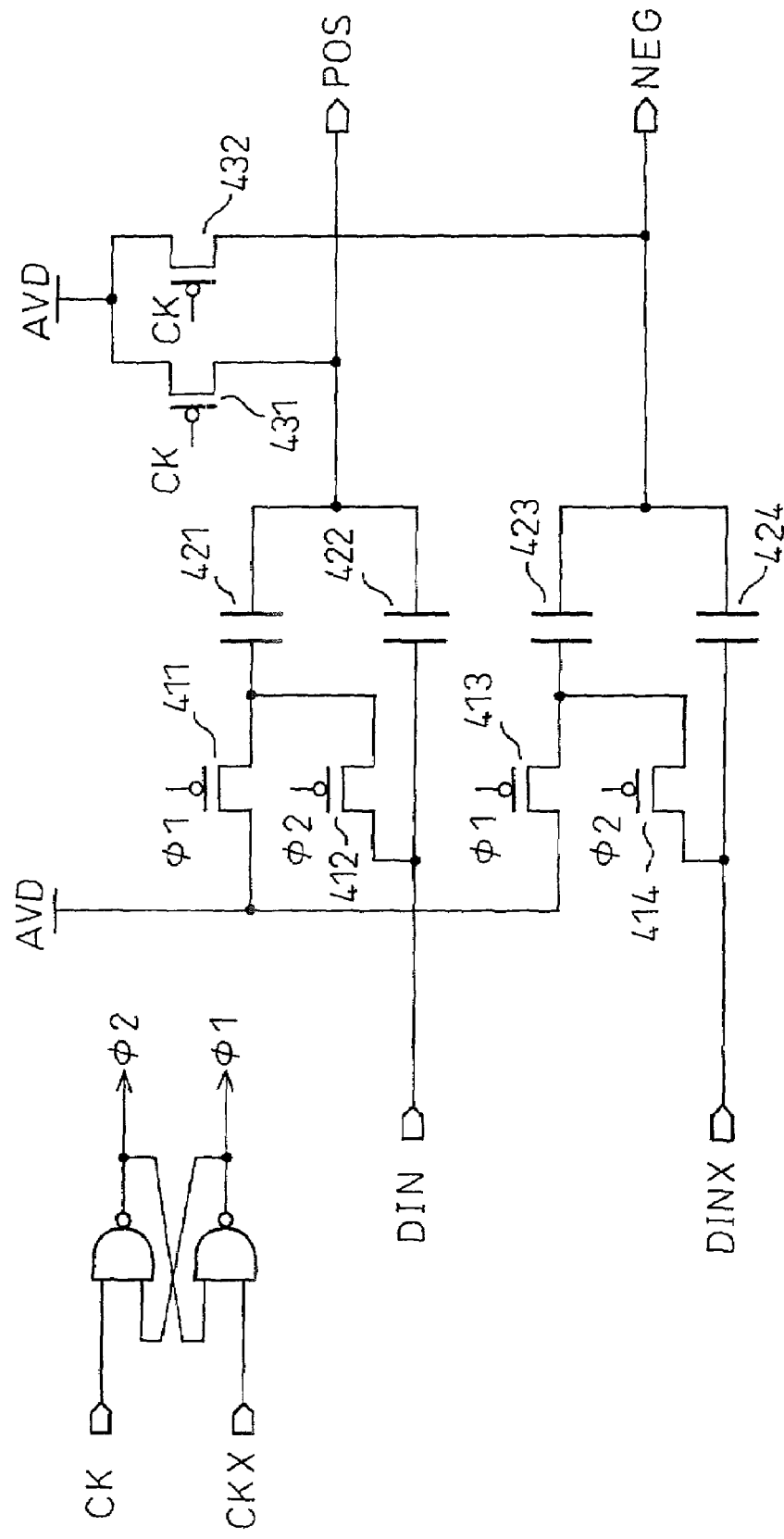
FIG. 21 is a circuit diagram showing an example of an equalizer circuit of the receiving LSI of FIG. 20.

FIG. 21 is a circuit diagram showing an example of the equalizer circuit (3241) of the receiving LSI (302) shown in FIG. 20.

As shown in FIG. 21, the equalizers 3241 to 3244 each comprise PMOS transistors 411 to 414, 431, 432 and capacitors 421 to 424. The transistors 431 and 432 are controlled by the clock CK, and when the clock CK is reduced to low level "L,", turn on so that the outputs (POS, NEG) are precharged to the level of the high potential source voltage AVD. The transistors 411 to 414 are controlled by control signals $\phi 1$, $\phi 2$ to remove the ISI (Inter-Symbol Interference) by the PRD (Partial Response Detection). The control signals $\phi 1$, $\phi 2$, which substantially correspond to the clocks CK, CKX, respectively, are displaced out of timing with each other by a NAND gate so as not to turn on both the transistors 411 and 422 at a time. The clocks CK and CKX represent, for example, the clocks CK3, CK1 which are 180 degrees out of phase with each other in FIG. 20.

In the equalizer 3241 shown in FIG. 21, the transistors 411, 413 are in on state and the transistors 412, 414 in off state when the control signal $\phi 1$ is at low level "L" (when the control signal $\phi 2$ is at high level "H"). The transistors 431 and 432 are also on, and therefore the two electrodes of each of the capacitors 421 and 423 are impressed with a high potential source voltage AVD. Further, one electrode of each of the capacitors 422, 424 is supplied with the input signals DIN, DINX, respectively, while the other electrode of each of the capacitors 422, 424 is supplied with the high potential source voltage AVD. Thus, the capacitors are precharged.

When the control signal $\phi 1$ rises to high level "H" (when the control signal $\phi 2$ falls to low level "L"), the transistors 411, 413 turn off while the transistors 412, 414 turn on, so that the capacitors 421, 423 are connected in parallel to each other and so are the capacitors 422, 424. In the process, the transistors 431, 432 are in off state and the outputs POS, NEG of the equalizer 3241 are disconnected from the high potential power line (AVD). Thus, the input signals DIN, DINX less ISI are output. The outputs (POS, NEG) of the equalizer 3241 are applied as differential input signals to the differential amplifier circuit 3211 in the next stage.

Figure 22:
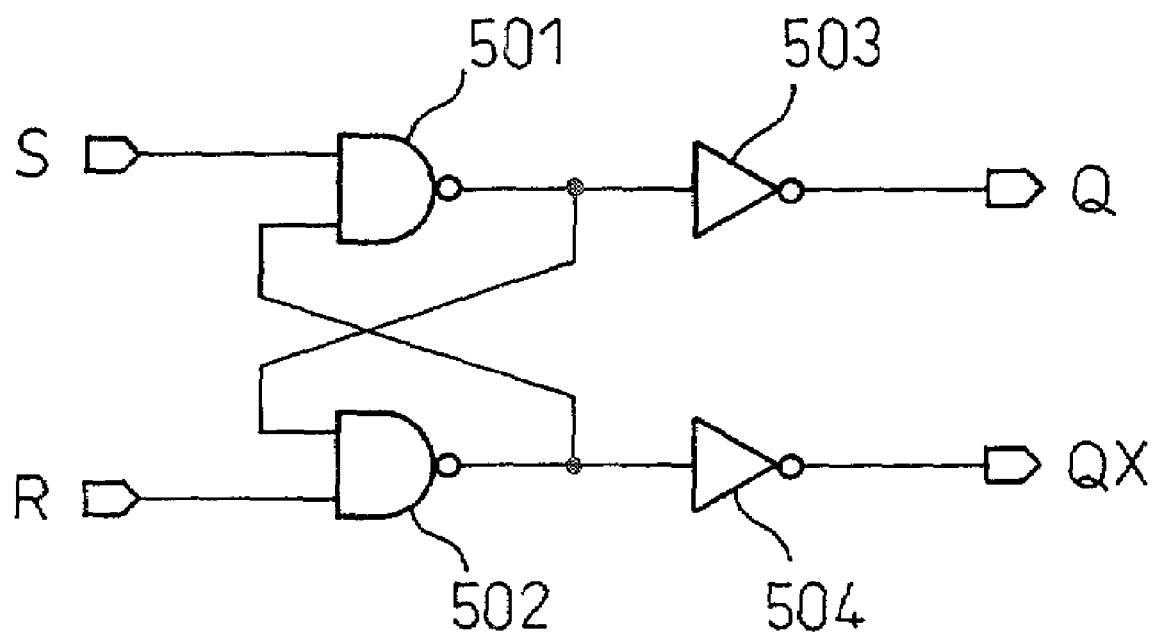
FIG. 22 is a circuit diagram showing an example of a SR latch of the receiving LSI of FIG. 20.

FIG. 22 is a circuit diagram showing an example of the SR latch (3221) of the receiving LSI (302) shown in FIG. 20.

As shown by the SR latch 3221 as a representative in FIG. 22, each of the SR latches 3221 to 3224 includes NAND gates 501, 502 with one of the inputs and the output thereof cross-coupled, and inverters 503, 504 connected to the outputs of the NAND gates 501, 502. The differential output signals (S, R) from the differential amplifier circuit 3211 are applied to and held at the other input of each of the NAND gates 501, 502, and after being further inverted in the inverters 503, 504, output as differential signals Q, QX.

Figure 23:
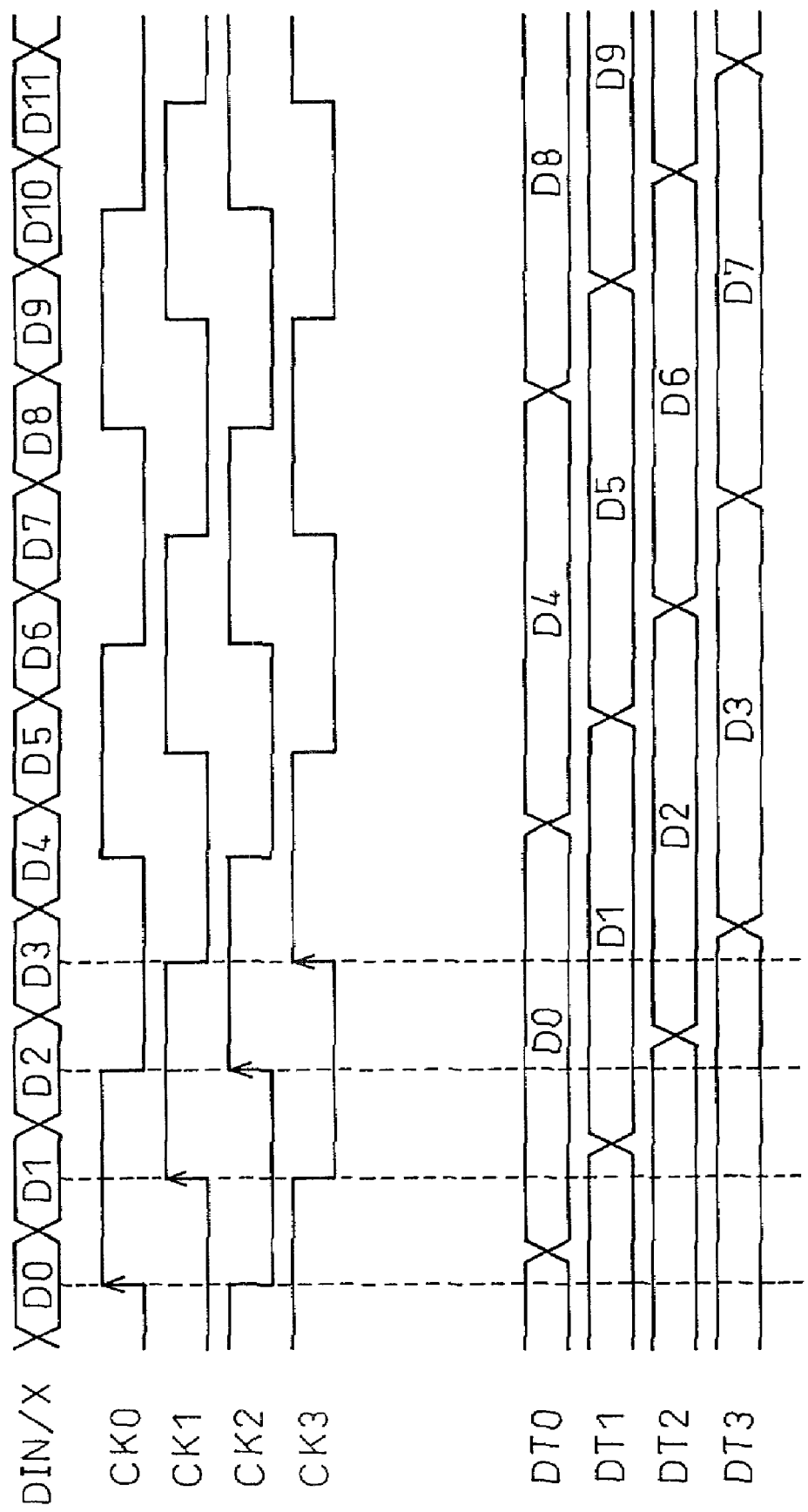
FIG. 23 is a timing chart for explaining the operation of the receiving LSI shown in FIG. 20.

FIG. 23 is a timing chart for explaining the operation of the receiving LSI shown in FIG. 20.

As shown in FIG. 23, the receiving LSI (4-way interleave-type DPRD receiver) 302 shown in FIG. 20 is such that four sets of an equalizer, a differential amplifier circuit and a SR latch (3241, 3211, 3221; 3242, 3212, 3222; 3243, 3213, 3223; 3244, 3214, 3224) are activated in response to four-phase clocks CK0 to CK3 thereby to retrieve differential output signals (output data DT0 to DT3) of 625 MHz from differential input signals (input data DIN, DINX) of 2.5 GHz, for example.

Figure 24:
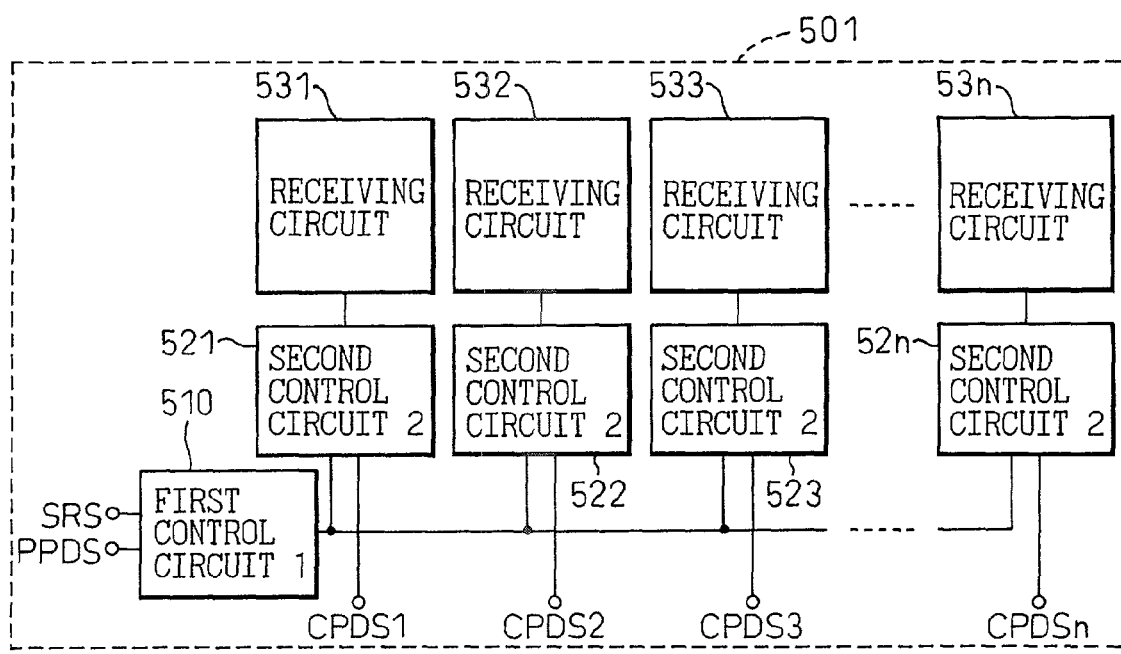
FIG. 24 is a block diagram showing an example of a router as another example to which a differential amplifier circuit according to the invention is applicable.
Figure 25A:
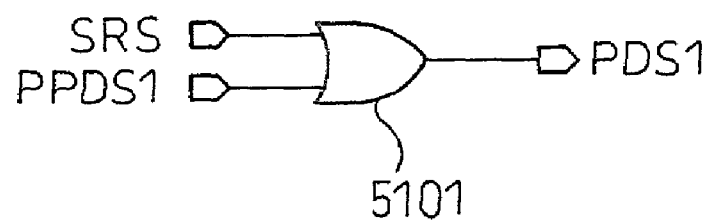
FIGS. 25A and 25B are logic circuit diagrams schematically showing an example of a first control circuit and a second control circuit, respectively, of the router shown in FIG. 24.
Figure 25B:
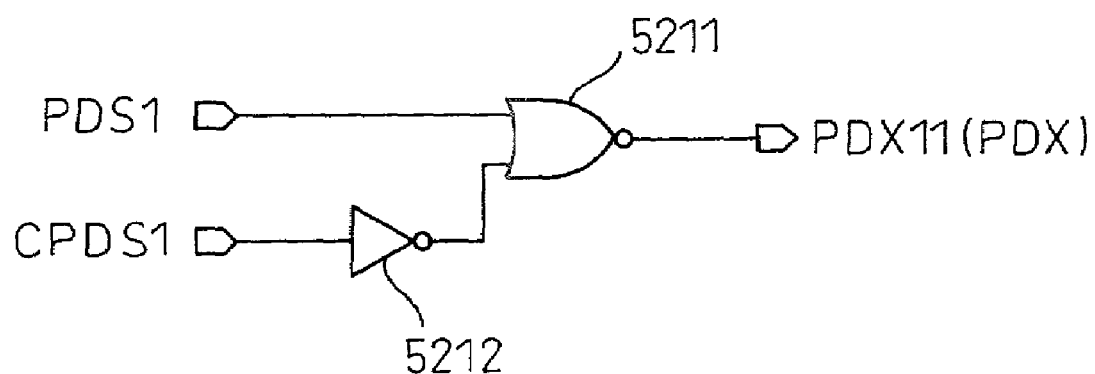

FIG. 24 is a block diagram showing an example of a router representing still another application of the differential amplifier circuit according to the invention. FIGS. 25A, 25B are logic circuit diagrams schematically showing an example of a first control circuit and a second control circuit of the router shown in FIG. 24. The first control circuit 510 of the router 501 of FIG. 24 is shown in FIG. 25A, and the second control circuit 521 of the router 501 of FIG. 24 is shown in FIG. 25B.

In FIGS. 24, 25A, 25B, reference character SRS designates a system reset signal (active at high level "H"), character PPDS a port power down signal (active at high level "H"), and CPDS a channel power down signal (active at low level "L"). The system reset signal SRS is for resetting the whole router (all the circuits of the LSI having differential amplifier circuits mounted thereon), the port power down signal PPDS is for resetting the ports 501 to 504 each having a plurality of receiving circuits (n receiving circuits 531 to 53n), and the channel power down signal CPDS is for resetting a plurality of the receiving circuits 531 to 53n of each port individually.

As shown in FIG. 24, the router includes four ports including first to fourth ports (designated by reference numerals 501 to 504). Each of the ports 501 to 504 includes the first control circuit 510, the second control circuits 521 to 52n and the receiving circuits 531 to 53n. The receiving circuits 531 to 53n each include a differential amplifier circuit described above with reference to, for example, the first embodiment (FIG. 8) or the second embodiment (FIG. 9) of the invention.

As shown in FIG. 25A, the first control circuit 510 is configured of an OR gate 5101, which outputs a power down signal PDS as a logic sum of the system reset signal SRS and the port power down signal PPDS. In the case where at least one of the system reset signal SRS and the port power down signal PPDS is active (at high level "H"), the output signal PDS1 assumes high level "H".

As shown in FIG. 25B, the second control circuit 521 includes a NOR gate 5211 and an inverter 5212 and outputs an inverted signal PDX11 (the control signal PDX in FIGS. 8 and 9) of the logic sum of the inverted signal of the channel power down signal CPDS and the output signal PDS0 of the first control circuit 510.

Specifically, the second control circuit 521 is adapted to output an output signal of high level "H" (PDX11) when at least one of the system reset signal SRS, the port power down signal PPDS and the channel power down signal CPDS is active (reset). According to the first and second embodiments of the invention, therefore, when at least one of the system reset signal SRS, the port power down signal PPDS and the channel power down signal CPDS is active, the control signal PDX assumes a high level "H" and the transistor 3 turns on, with the result that a minute current flows in the circuit (differential input transistors 1, 2).

Figure 26:
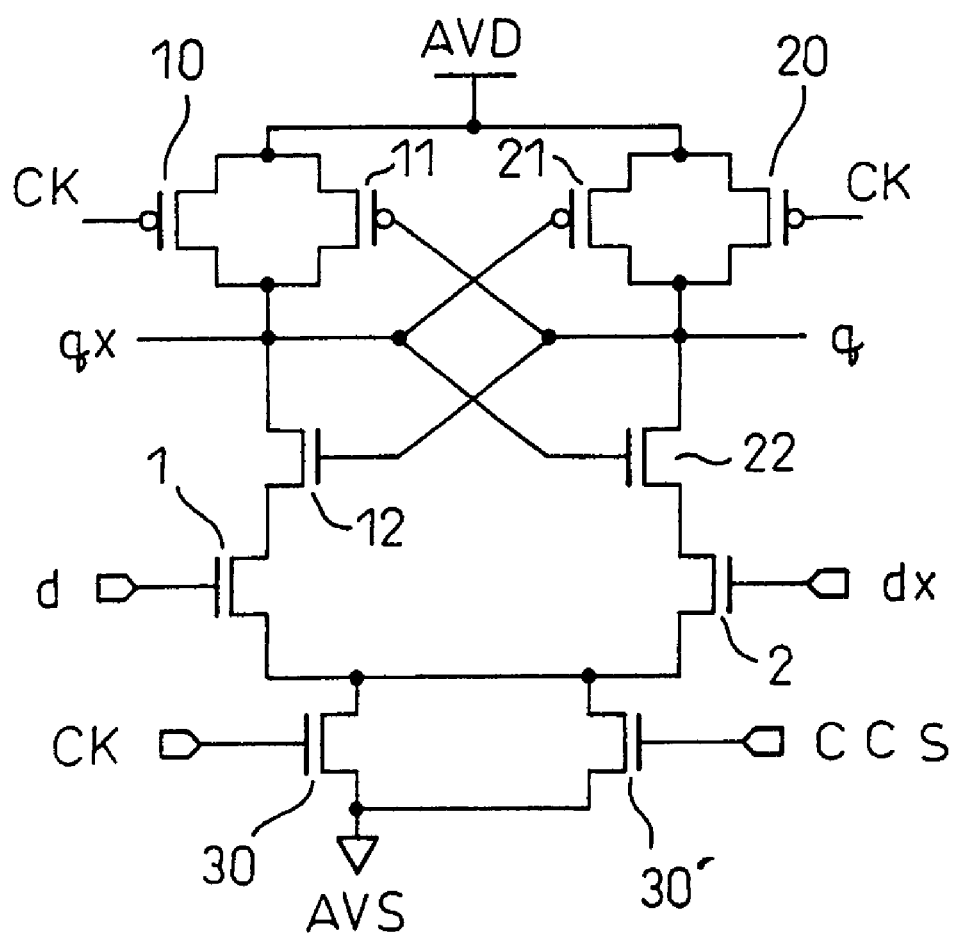
FIG. 26 is a circuit diagram showing a differential amplifier circuit according to an embodiment of the invention.

FIG. 26 is a circuit diagram showing a differential amplifier circuit according to an embodiment of the invention. The differential amplifier circuit of FIG. 26 is similar to the differential amplifier circuit of FIG. 8, but includes the transistor 30' of FIG. 11A, which is supplied with the current control signal CCS, in place of the third transistor 3 of FIG. 8. The transistor 30', similar to the third transistor 3 of FIG. 8, has a smaller gate width than the fourth transistor 30.

Figure 27:
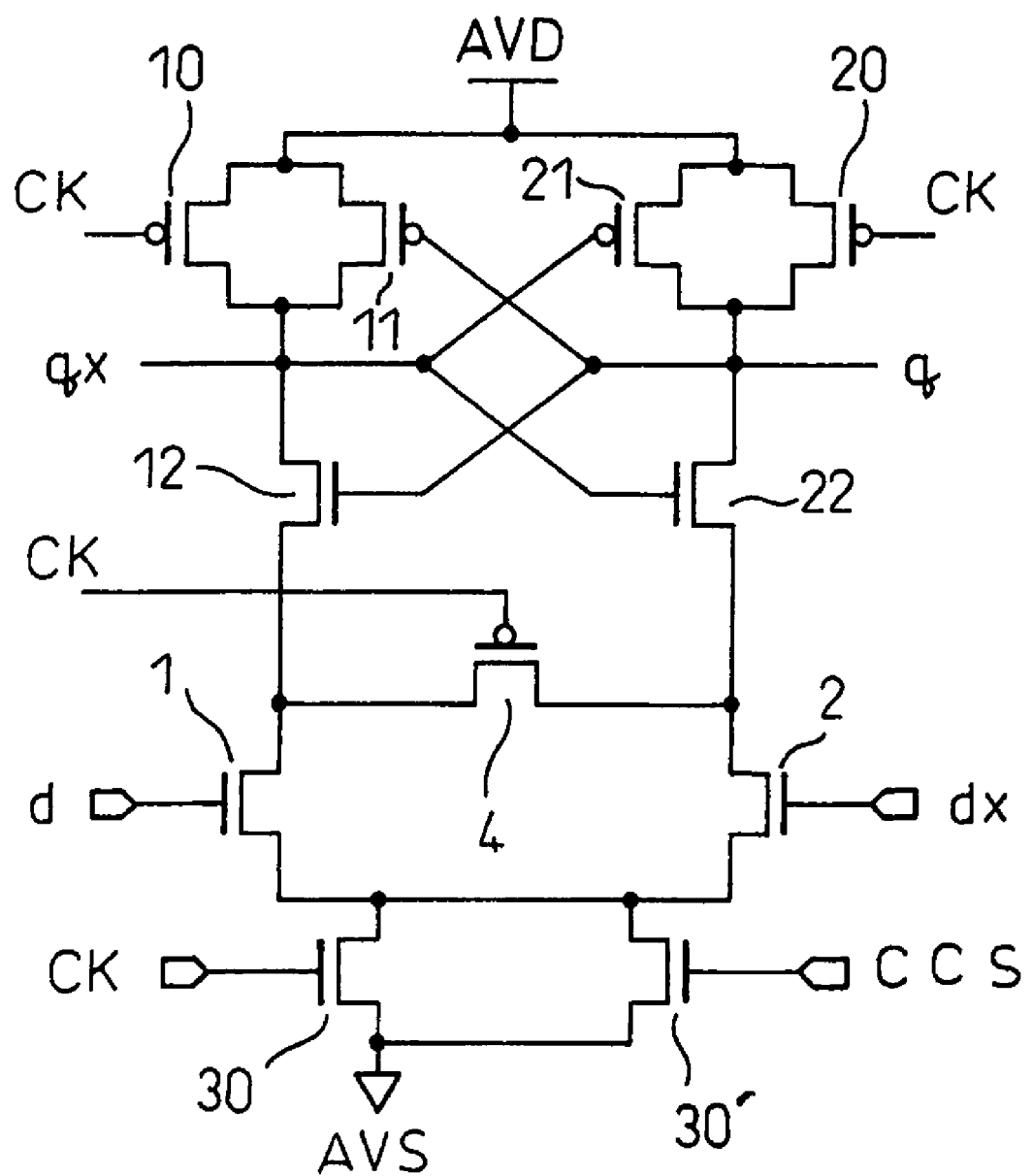
FIG. 27 is a circuit diagram showing a differential amplifier circuit according to an embodiment of the invention.

FIG. 27 is a circuit diagram showing a differential amplifier circuit according to an embodiment of the invention. The differential amplifier circuit of FIG. 27 is similar to the differential amplifier circuit of FIG. 9, but replaces transistor 3 with transistor 30' of FIG. 11A, which is supplied with the current control signal CCS. The current control signal CCS may be generated using the circuit shown in FIG. 11B. An example of the current control signal is shown in FIG. 12.

Figure 28:
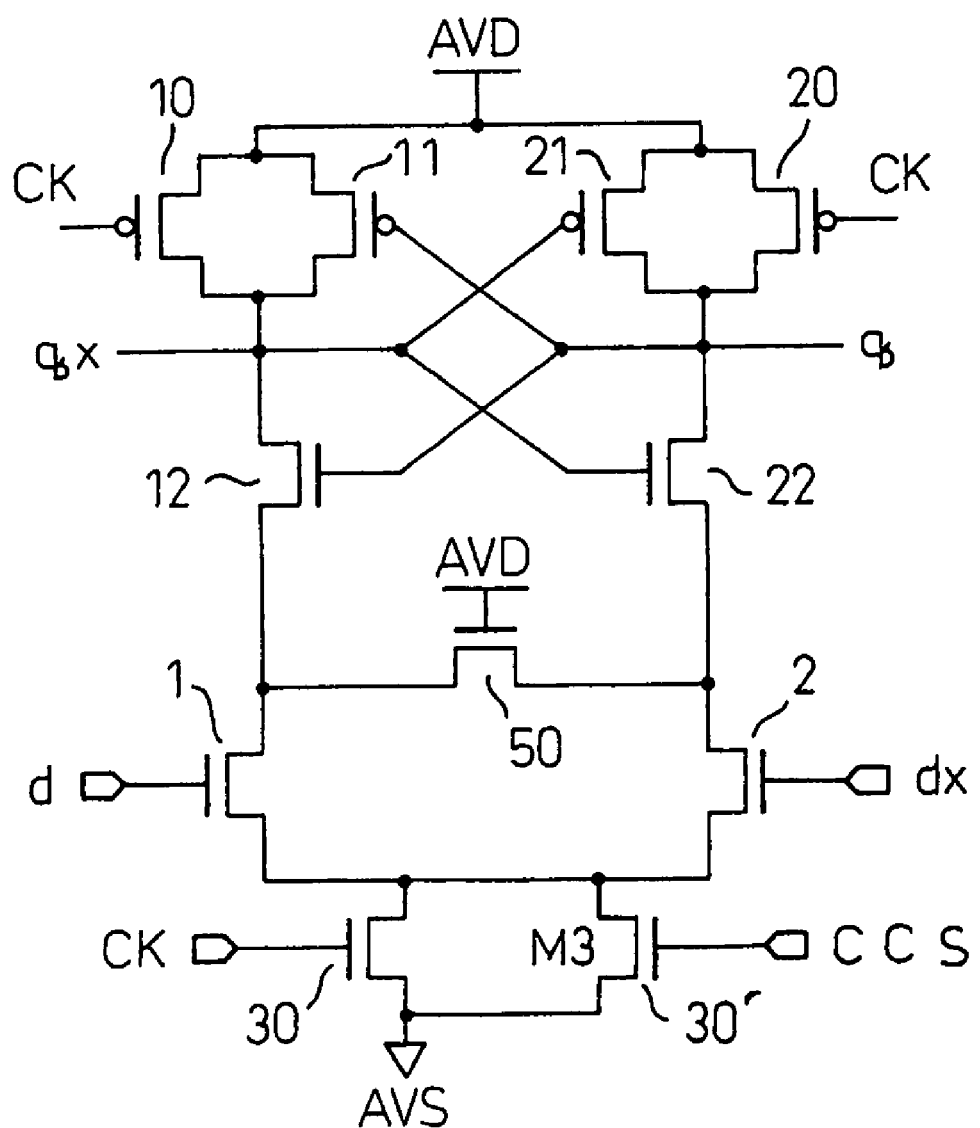
FIG. 28 is a circuit diagram showing a differential amplifier circuit according to an embodiment of the invention.

FIG. 28 is a circuit diagram showing a differential amplifier circuit according to an embodiment of the invention. The differential amplifier circuit of FIG. 28 is similar to the differential amplifier circuit of FIG. 13, but replaces transistor 3 with transistor 30' of FIG. 11A, which is supplied with the current control signal CCS. The current control signal CCS may be generated using the circuit shown in FIG. 11B. An example of the current control signal is shown in FIG. 12.

Figure 29:
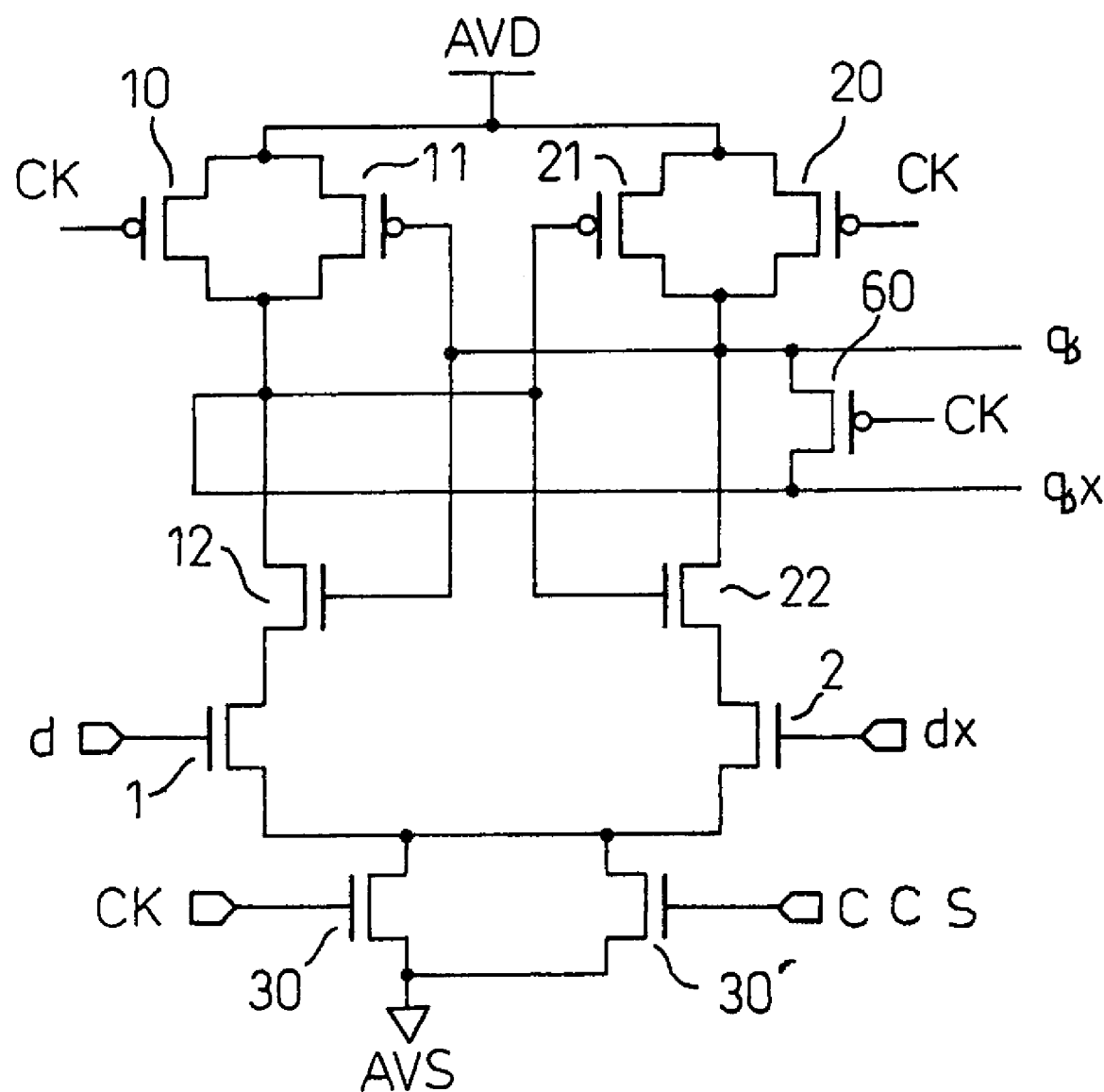
FIG. 29 is a circuit diagram showing a differential amplifier circuit according to an embodiment of the invention.

FIG. 29 is a circuit diagram showing a differential amplifier circuit according to an embodiment of the invention. The differential amplifier circuit of FIG. 29 is similar to the differential amplifier circuit of FIG. 14, but replaces transistor 3 with transistor 30' of FIG. 11A, which is supplied with the current control signal CCS. The current control signal CCS may be generated using the circuit shown in FIG. 11B. An example of the current control signal is shown in FIG. 12.

Figure 30:
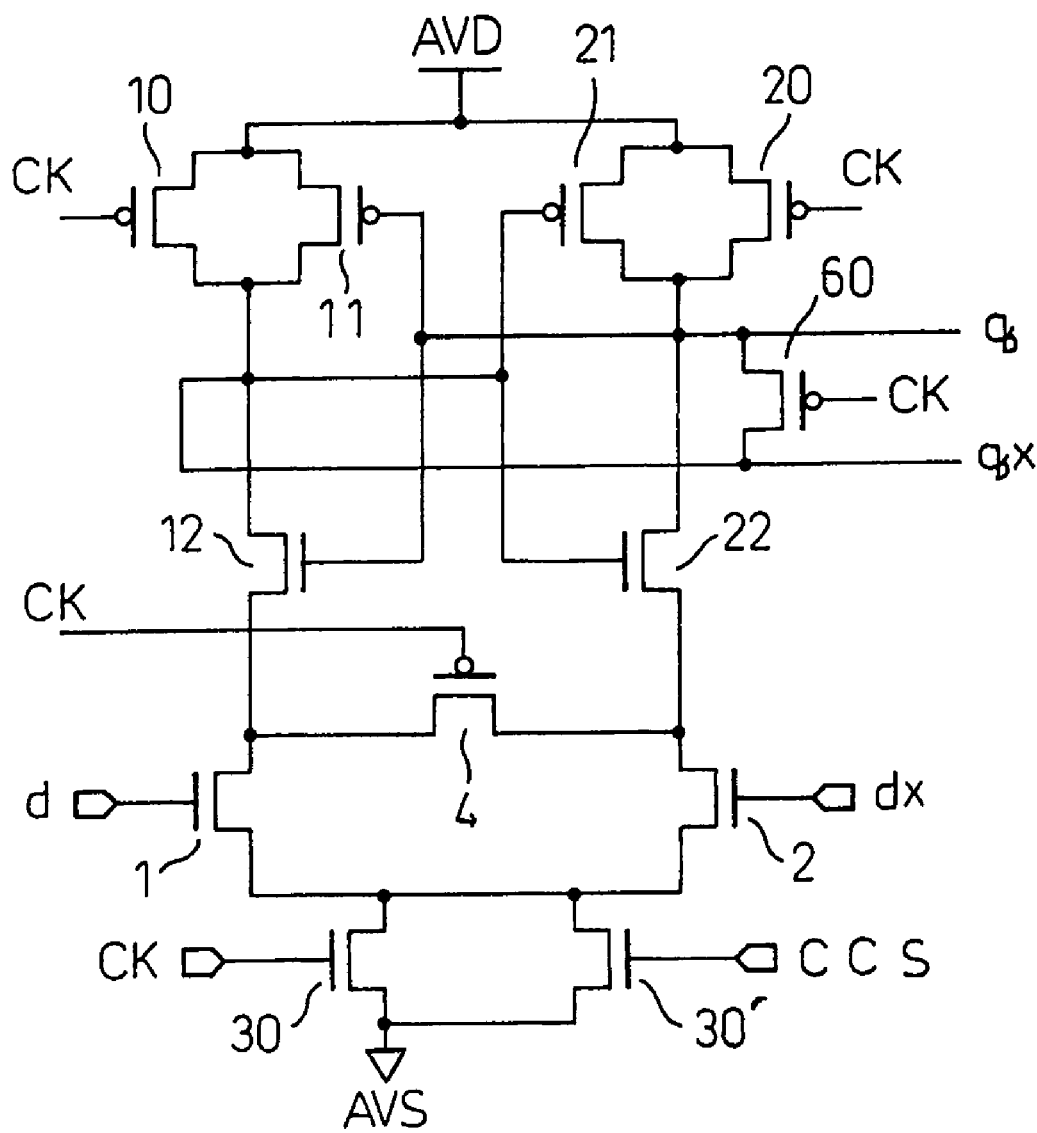
FIG. 30 is a circuit diagram showing a differential amplifier circuit according to an embodiment of the invention.

FIG. 30 is a circuit diagram showing a differential amplifier circuit according to an embodiment of the invention. The differential amplifier circuit of FIG. 30 is similar to the differential amplifier circuit of FIG. 15, but replaces transistor 3 with transistor 30' of FIG. 11A, which is supplied with the current control signal CCS. The current control signal CCS may be generated using the circuit shown in FIG. 11B. An example of the current control signal is shown in FIG. 12.

Figure 31:
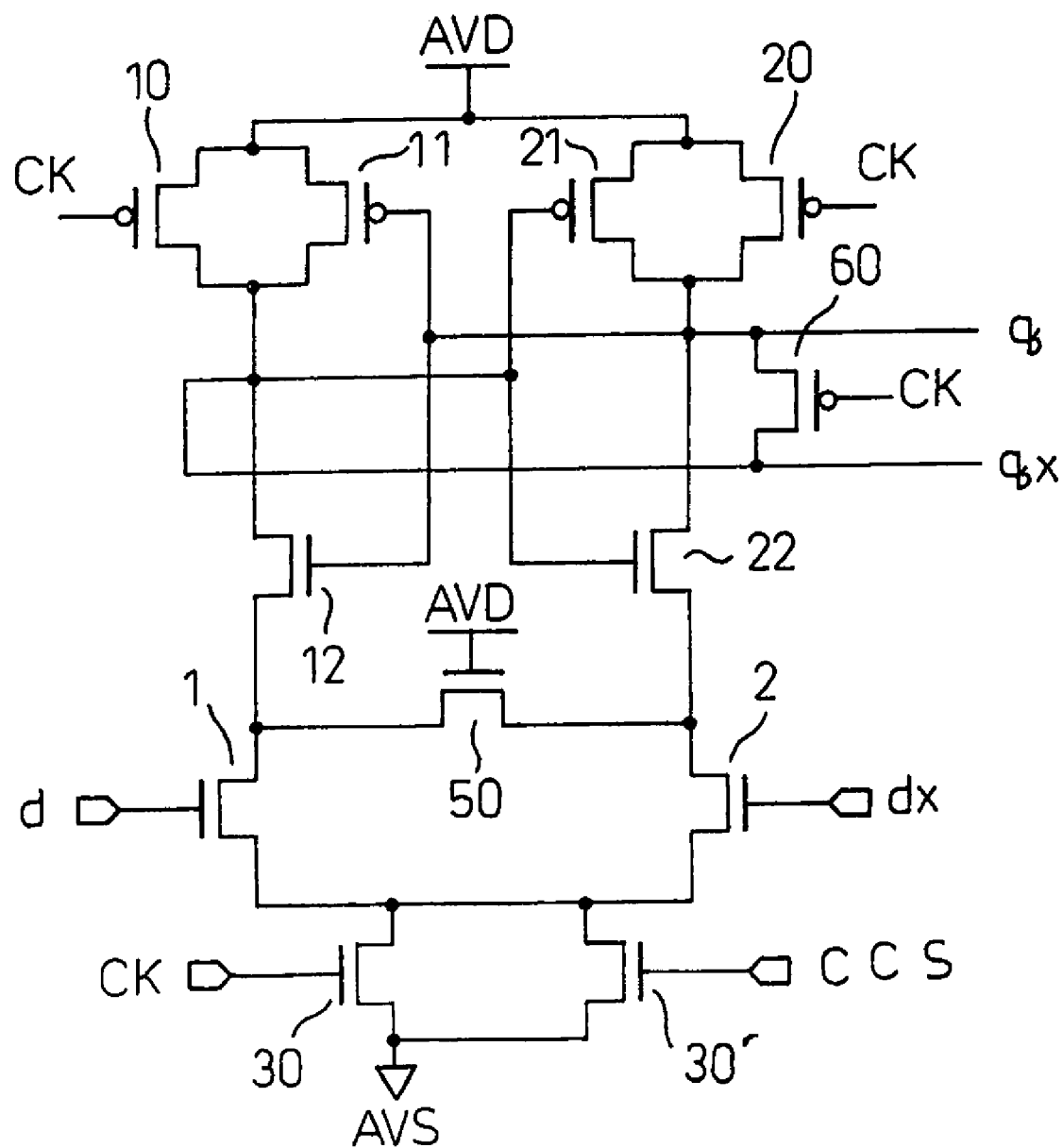
FIG. 31 is a circuit diagram showing a differential amplifier circuit according to an embodiment of the invention.

FIG. 31 is a circuit diagram showing a differential amplifier circuit according to an embodiment of the invention. The differential amplifier circuit of FIG. 31 is similar to the differential amplifier circuit of FIG. 16, but replaces transistor 3 with transistor 30' of FIG. 11A, which is supplied with the current control signal CCS. The current control signal CCS may be generated using the circuit shown in FIG. 11B. An example of the current control signal is shown in FIG. 12.

Figure 32:
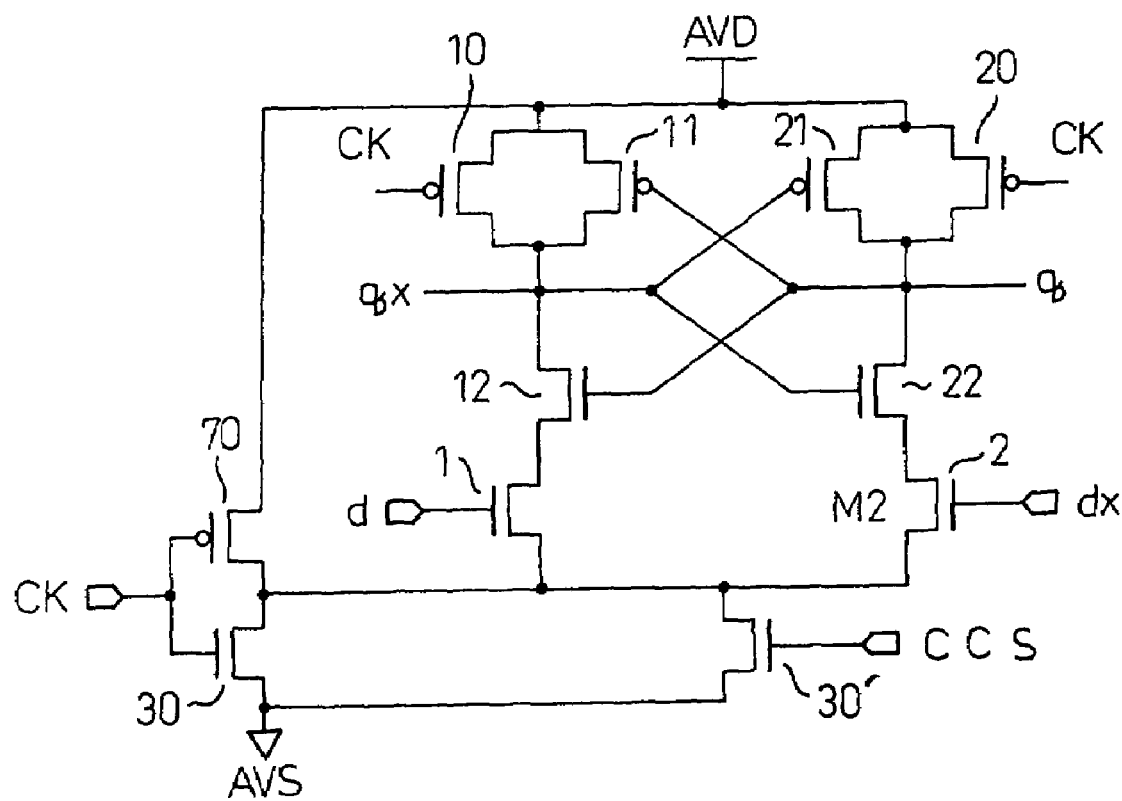
FIG. 32 is a circuit diagram showing a differential amplifier circuit according to an embodiment of the invention.

FIG. 32 is a circuit diagram showing a differential amplifier circuit according to an embodiment of the invention. The differential amplifier circuit of FIG. 32 is similar to the differential amplifier circuit of FIG. 17, but replaces transistor 3 with transistor 30' of FIG. 11A, which is supplied with the current control signal CCS. The current control signal CCS may be generated using the circuit shown in FIG. 11B. An example of the current control signal is shown in FIG. 12.

It will thus be understood from the foregoing detailed description that according to this invention, there are provided a differential amplifier circuit and a semiconductor integrated circuit device comprising the differential amplifier circuit which can accurately amplify even a signal high in speed and small in amplitude.

Many different embodiments of the present invention may be constructed without departing from the spirit and scope of the present invention, and it should be understood that the present invention is not limited to the specific embodiments described in this specification except as defined in the appended claims.

What is claimed is:

1. A differential amplifier circuit comprising a latch unit and a differential input portion, wherein:
   said differential input portion comprises a first transistor and a second transistor each having a first electrode, a second electrode and a control electrode;
   the control electrodes of said first and second transistors are supplied with a differential input signal;
   a third transistor is inserted between a first power line and a common node to which the first electrodes of said first and second transistors are connected, said third transistor keeps a minute current flowing through said first and second transistors in response to a clock signal at a first level, said third transistor supplies a first drive current, in response to the clock signal at a second level, said first drive current through said third transistor is larger than said minute current;
   a fourth transistor is inserted between said first power line and the common node to which the first electrodes of said first and second transistors are connected, said fourth transistor supplies a second drive current in response to the clock signal at the second level; and
   said third transistor is connected in parallel to said fourth transistor.

2. The differential amplifier circuit as claimed in claim 1, wherein said third transistor turns off said minute current flowing through said first and second transistors upon deactivation of a power supply to said differential amplifier circuit.

3. The differential amplifier circuit as claimed in claim 1, wherein the control electrode of said third transistor is supplied with a first control signal, in response to the clock signal at the first level, for supplying the minute current during the operation of said differential amplifier and a second control signal, in response to the clock signal at the second level, for supplying the first drive current.

4. The differential amplifier circuit as claimed in claim 1, wherein a gate width of said third transistor is smaller than a gate width of said fourth transistor.

5. The differential amplifier circuit as claimed in claim 1, wherein a first control signal supplied to the control electrode of said third transistor is set to a level for supplying the first drive current at a predetermined level in response to the clock signal at the second level, white causing the minute current to flow through said first and second transistors in response to the clock signal at the first level during the operation of said differential amplifier.

6. The differential amplifier circuit as claimed in claim 1, wherein said latch unit comprises:
   a first inverter inserted between the second electrode of said first transistor and a second power line; and
   a second inverter inserted between the second electrode of said second transistor and said second power line, said first and second inverters being cross-coupled to each other.

7. The differential amplifier circuit as claimed in claim 6, wherein:
   said differential amplifier circuit is configured of MOS transistors;
   transistors of said first and second inverters which are connected to said second power line are each connected in parallel to an additional transistor, respectively; and
   the second electrode of each of said first and second transistors is held at a predetermined level in response to the clock signal at the first level during the operation of said differential amplifier.

8. The differential amplifier circuit as claimed in claim 1, further comprising:
   a fifth transistor connected to the second electrode of said first transistor and the second electrode of said second transistor for shorting the second electrodes of said first and second transistors in response to the clock signal at the first level.

9. The differential amplifier circuit as claimed in claim 1, further comprising:
   a sixth transistor connected to the second electrode of said first transistor and the second electrode of said second transistor, said sixth transistor having a control electrode supplied with a predetermined voltage.

10. The differential amplifier circuit as claimed in claim 9, wherein said differential input signal is at CML level.

11. The differential amplifier circuit as claimed in claim 1, further comprising:
    a seventh transistor inserted between two nodes for retrieving a differential output signal, said seventh transistor shorting said two nodes in response to the clock signal at the first level.

12. The differential amplifier circuit as claimed in claim 1, further comprising:
    an eighth transistor inserted between a second power line and the common node to which the first electrodes of said first and second transistors are connected, the control electrode of said eighth transistor being supplied with the clock signal.

13. The differential amplifier circuit as claimed in claim 1, wherein said differential amplifier circuit is a differential sense amplifier circuit of strong arm latch type.

14. A semiconductor integrated circuit device having a differential amplifier circuit receiving a differential signal, a latch circuit latching an output signal of said differential amplifier circuit, and a clock source generating a clock signal and supplying the generated clock signal to said differential amplifier circuit, wherein said differential amplifier circuit comprises a latch unit and a differential input portion, wherein:
    said differential input portion comprises a first transistor and a second transistor each having a first electrode, a second electrode and a control electrode;
    the control electrodes of said first and second transistors are supplied with the differential input signal;
    a third transistor is inserted between a first power line and a common node to which the first electrodes of said first and second transistors are connected, said third transistor keeps a minute current flowing through said first and second transistors in response to the clock signal at a first level, said third transistor supplies a first drive current, in response to the clock signal at a second level, said drive current through said third transistor is larger than said minute current;
    a fourth transistor is inserted between said first power line and the common node to which the first electrodes of said first and second transistors are connected, said fourth transistor supplying a second drive current in response to the clock signal at the second level; and
    said third transistor is connected in parallel to said fourth transistor.

15. The semiconductor integrated circuit device as claimed in claim 14, wherein said semiconductor integrated circuit is a receiving circuit of a signal transmission system, said signal transmission system comprising a transmission circuit outputting the differential signal, a signal transmission path, and said receiving circuit receiving the differential signal through said signal transmission path.

16. The semiconductor integrated circuit device as claimed in claim 15, wherein the receiving circuit further comprises:
an equalizer circuit coupled between the transmission circuit and the differential amplifier circuit, wherein the equalizer circuit receives the differential signal, removes an Inter-Symbol Interference of the differential signal by a Partial Response Detection, and outputs the Inter-Symbol Interference removed differential signal to said differential amplifier circuit.

17. The semiconductor integrated circuit device as claimed in claim 14, wherein said third transistor turns off said minute current flowing through said first and second transistors upon deactivation of a power supply to said differential amplifier circuit.

18. The semiconductor integrated circuit device as claimed in claim 14, wherein the control electrode of said third transistor is supplied with a first control signal, in response to the clock signal at the first level, for supplying the minute current during the operation of said differential amplifier and a second control signal, in response to the clock signal at the second level, for supplying the first drive current.

19. The semiconductor integrated circuit device as claimed in claim 14, wherein a gate width of said third transistor is smaller than a gate width of said fourth transistor.

20. The semiconductor integrated circuit device as claimed in claim 14, wherein a first control signal supplied to the control electrode of said third transistor is set to a level for supplying the first drive current at a predetermined level, in response to the clock signal at the second level, while causing the minute current to flow through said first and second transistors, in response to the clock signal at the first level, during the operation of said differential amplifier.

21. The semiconductor integrated circuit device as claimed in claim 14, wherein said latch unit comprises:
a first inverter inserted between the second electrode of said first transistor and a second power line; and
a second inverter inserted between the second electrode of said second transistor and said second power line, said first and second inverters being cross-coupled to each other.

22. The semiconductor integrated circuit device as claimed in claim 21, wherein:
said differential amplifier circuit is configured of MOS transistors;
transistors of said first and second inverters which are connected to said second power line are each connected in parallel to an additional transistor, respectively; and
the second electrode of each of said first and second transistors is held at a predetermined level, in response to the clock signal at the first level, during the operation of said differential amplifier.

23. The semiconductor integrated circuit device as claimed in claim 14, wherein said differential amplifier circuit further comprising:
a fifth transistor connected to the second electrode of said first transistor and the second electrode of said second transistor for shorting the second electrodes of said first and second transistors in response to the clock signal at the first level.

24. The semiconductor integrated circuit device as claimed in claim 14, wherein said differential amplifier circuit further comprising:

a sixth transistor connected to the second electrode of said first transistor and the second electrode of said second transistor, said sixth transistor having a control electrode supplied with a predetermined voltage.

25. The semiconductor integrated circuit device as claimed in claim 24, wherein said differential input signal is at CML level.

26. The semiconductor integrated circuit device as claimed in claim 14, wherein said differential amplifier circuit further comprising:
a seventh transistor inserted between two nodes for retrieving the output signal of said differential amplifier circuit, said seventh transistor shorting said two nodes in response to the clock signal at the first level.

27. The semiconductor integrated circuit device as claimed in claim 14, wherein said differential amplifier circuit further comprising:
an eighth transistor inserted between a second power line and the common node to which the first electrodes of said first and second transistors are connected, the control electrode of said eighth transistor being supplied with the clock signal.

28. The semiconductor integrated circuit device as claimed in claim 14, wherein said differential amplifier circuit is a differential sense amplifier circuit of strong arm latch type.

29. A circuit device comprising:
a transmission circuit outputting a differential signal;
a signal transmission path; and
a receiving circuit receiving the differential signal through said signal transmission path, wherein
the receiving circuit comprises a plurality of receiving units, said plurality of receiving units carrying out an interleave operation, and wherein
each of the plurality of receiving units comprises:
a differential amplifier circuit receiving an Inter-Symbol Interference removed differential signal, a latch circuit latching an output signal of said differential amplifier circuit, and a clock source generating a clock signal and supplying the clock signal to said differential amplifier circuit, wherein said differential amplifier circuit comprises a latch unit and a differential input portion, wherein:
said differential input portion comprises a first transistor and a second transistor each having a first electrode, a second electrode and a control electrode;
the control electrodes of said first and second transistors are supplied with the Inter-Symbol Interference removed differential input signal;
a third transistor for keeping a minute current to flow through said first and second transistors is inserted between a first power line and a common node to which the first electrodes of said first and second transistors are connected in response to a first level of the clock signal, wherein said third transistor supplies a drive current in response to a second level of the clock signal at the time of signal determination in said differential amplifier circuit; and
an equalizer circuit, receiving the differential signal, removing an Inter-Symbol Interference of the differential signal by a Partial Response Detection, and outputting the Inter-Symbol Interference removed differential signal to said differential amplifier circuit.

30. A receiving circuit of a signal transmission system, said signal transmission system comprising a transmission circuit outputting a differential signal, a signal transmission path, and said receiving circuit receiving the differential signal through said signal transmission path, the receiving circuit comprising a receiving unit, wherein the receiving unit comprises:
- a differential amplifier circuit, said differential amplifier circuit including a latch unit and a differential input portion, wherein a minute current is kept to flow through said differential input portion;
- a latch circuit latching an output signal of said differential amplifier circuit;
- a clock source generating a clock and supplying the generated clock to said differential amplifier circuit; and
- an equalizer circuit for receiving the differential signal, removing an Inter-Symbol Interference of the differential signal by a Partial Response Detection, and outputting the Inter-Symbol Interference removed differential signal to said differential amplifier circuit.

31. The receiving circuit of a signal transmission system as claimed in claim 30, wherein the receiving circuit further comprises at least one additional receiving unit, each additional receiving unit including said differential amplifier circuit, said latch circuit and said equalizer circuit, said receiving circuit carrying out an interleave operation.

32. A differential amplifier circuit comprising a latch unit and a differential input portion, wherein:
- said differential input portion comprises a first transistor and a second transistor each having a first electrode, a second electrode and a control electrode;
- the control electrodes of said first and second transistors are supplied with a differential input signal;
- a third transistor is inserted between a first power line and a common node to which the first electrodes of said first and second transistors are connected, a gate electrode of said third transistor receives a control signal of which level is changed in accordance with the operation of said differential amplifier circuit, said third transistor keeps a minute current flowing through said first and second transistors, in response to said control signal at a first level, said third transistor supplies a first drive current, in response to said control signal at a second level, said first drive current through said third transistor is larger than said minute current; and
- an eighth transistor inserted between a second power line and the common node to which the first electrodes of said first and second transistors are connected, the control electrode of said eighth transistor being supplied with clock signal.

33. A semiconductor integrated circuit device having a differential amplifier circuit receiving a differential signal, a latch circuit latching an output signal of said differential amplifier circuit, and a clock source generating a clock and supplying the generated clock to said differential amplifier circuit, wherein said differential amplifier circuit comprises a latch unit and a differential input portion, wherein:
- said differential input portion comprises a first transistor and a second transistor each having a first electrode, a second electrode and a control electrode;
- the control electrodes of said first and second transistors are supplied with the differential input signal;
- a third transistor is inserted between a first power line and a common node to which the first electrodes of said first and second transistors are connected, a gate electrode of said third transistor receives a control signal of which level is changed in accordance with the operation of said differential amplifier circuit, said third transistor keeps a minute current flowing through said first and second transistors in response to said control signal at a first level, said third transistor supplies a first drive current in response to said control signal at a second level, said first drive current through said third transistor is larger than said minute current; and
- an eighth transistor inserted between a second power line and the common node to which the first electrodes of said first and second transistors are connected, the control electrode of said eighth transistor being supplied with a clock signal.

* * * * *